United States Patent
Ge et al.

(10) Patent No.: US 11,121,464 B2
(45) Date of Patent: Sep. 14, 2021

(54) PHASED ARRAY CORRECTION AND TESTING METHOD AND CORRECTION AND TESTING APPARATUS

(71) Applicant: HUAWEI TECHNOLOGIES CO., LTD., Guangdong (CN)

(72) Inventors: Guangding Ge, Xi'an (CN); Xubo Zhao, Xi'an (CN); Deshuang Zhao, Chengdu (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 4 days.

(21) Appl. No.: 16/806,769

(22) Filed: Mar. 2, 2020

(65) Prior Publication Data
US 2020/0358177 A1 Nov. 12, 2020

Related U.S. Application Data

(63) Continuation of application No. PCT/CN2018/085202, filed on Apr. 28, 2018.

(30) Foreign Application Priority Data

Sep. 4, 2017 (CN) .......................... 201710786716.2

(51) Int. Cl.
*H01Q 3/26* (2006.01)
*G01R 29/08* (2006.01)
(Continued)

(52) U.S. Cl.
CPC ............. *H01Q 3/267* (2013.01); *G01R 29/08* (2013.01); *H01Q 3/2611* (2013.01);
(Continued)

(58) Field of Classification Search
CPC .... G01R 29/08; G01R 29/0871; G01R 29/10; H01Q 3/2611; H01Q 3/267; H01Q 3/2682; H04B 17/12; H04W 24/00; H04W 24/06
(Continued)

(56) References Cited

U.S. PATENT DOCUMENTS

| 4,298,873 A | 11/1981 | Roberts |
| 4,700,192 A * | 10/1987 | Zezuto .................. H01Q 3/267 342/173 |

(Continued)

FOREIGN PATENT DOCUMENTS

| CN | 101483273 A | 7/2009 |
| CN | 102412441 A | 4/2012 |

(Continued)

OTHER PUBLICATIONS

Jiao Yu et al. Near—field Calibration of Active Phased Array Antenna, Telecommunication Engineering, vol. 56, No. 4, Apr. 2016. pp. 453-457. with English abstract.

(Continued)

*Primary Examiner* — Tan H Trinh
(74) *Attorney, Agent, or Firm* — Womble Bond Dickinson (US) LLP

(57) ABSTRACT

This application discloses a correction and testing system, comprising a first phased array, a second phased array, and a test instrument, wherein the first phased array comprises a first radio frequency RF channel, the test instrument is configured to: determine, based on a coupling signal, an amplitude deviation value and a phase deviation value that correspond to the first RF channel; if the amplitude deviation value and the phase deviation value satisfy a preset error correction condition, correct an amplitude coefficient and a phase coefficient that correspond to the first RF channel to (Continued)

obtain a target amplitude coefficient and a target phase coefficient; and measure performance indicator parameters of the first phased array by using the target amplitude coefficient and the target phase coefficient. The correction and testing system can improve test efficiency, reducing a floor area, and lowering costs.

20 Claims, 13 Drawing Sheets

(51) Int. Cl.
  *H04B 17/12* (2015.01)
  *H04W 24/00* (2009.01)
  *H04W 24/06* (2009.01)
(52) U.S. Cl.
  CPC .......... *H01Q 3/2682* (2013.01); *H04B 17/12* (2015.01); *H04W 24/00* (2013.01); *H04W 24/06* (2013.01)
(58) Field of Classification Search
  USPC ..... 455/67.11, 67.16, 115.1, 115.2; 342/154, 342/173
  See application file for complete search history.

(56) References Cited

U.S. PATENT DOCUMENTS

| | | | |
|---|---|---|---|
| 6,163,296 A | 12/2000 | Lier et al. | |
| 2014/0260628 A1* | 9/2014 | Devlin | G01N 29/262 73/620 |
| 2015/0039245 A1* | 2/2015 | Langlois | G01N 29/043 702/39 |
| 2015/0084810 A1* | 3/2015 | Lee | G01S 13/4463 342/154 |
| 2015/0357710 A1 | 12/2015 | Li | |
| 2020/0091608 A1* | 3/2020 | Alpman | H01Q 5/47 |

FOREIGN PATENT DOCUMENTS

| | | |
|---|---|---|
| CN | 104506253 A | 4/2015 |
| CN | 105162536 A | 12/2015 |
| CN | 105353229 A | 2/2016 |
| CN | 105911531 A | 8/2016 |
| CN | 106357351 A | 1/2017 |
| CN | 106443599 A | 2/2017 |
| CN | 107765104 A | 3/2018 |
| GB | 2171849 A | 9/1986 |
| JP | S6211305 A | 1/1987 |
| JP | 2560452 B2 | 12/1996 |
| WO | 2004013644 A1 | 2/2004 |
| WO | 2013052234 A1 | 4/2013 |
| WO | 2016022202 A1 | 2/2016 |

OTHER PUBLICATIONS

Qiang GU:"Research on Phase Array Antenna in Mid-field at Ka-band", CNKI, Beijing Institute of Technology, Jul. 2015. total 71 pages. With English abstract.

* cited by examiner

PHASED ARRAY CORRECTION AND TESTING METHOD AND CORRECTION AND TESTING APPARATUS

CROSS-REFERENCE TO RELATED APPLICATIONS

This application is a continuation of International Application No. PCT/CN2018/085202, filed on Apr. 28, 2018, which claims priority to Chinese Patent Application No. 201710786716.2, filed on Sep. 4, 2017. The disclosures of the aforementioned applications are hereby incorporated by reference in their entireties.

TECHNICAL FIELD

This application relates to the communications field, and in particular, to a phased array correction and testing method and a correction and testing apparatus.

BACKGROUND

A basic principle of a phased array is to implement power combination and beam scanning through superposition and phase variation of radiation waveforms of element antennas. Radiation performance of the phased array mainly depends on the element antennas and a beam control system, and is represented by a far-field directivity pattern. Due to a small spacing and strong mutual coupling between antenna elements of a phased array antenna, the phased array antenna has a decreased antenna gain and a raised side lobe level, and in a severe case, not only accurate beam scanning cannot be implemented, but also severe beam distortion may occur. Performance of a phased array may be affected by many factors, including device inconsistency in a channel error, a manufacturing tolerance, an assembly error, an environmental change, mutual coupling between array elements, a location deviation, a channel failure, and the like. Therefore, phased array correction, fault determining and locating, performance evaluation, maintenance-type correction, and testing are all very important.

During testing of a phased array antenna, measurement and correction are complementary. Currently, a conventional phased array antenna testing method is a remote field testing method. Specifically, a to-be-tested antenna apparatus is placed on a three-dimensionally rotating turntable, a test probe is placed at a far-field position of the to-be-tested antenna, and as the turntable rotates, all indicators of the antenna apparatus are tested through frequency sweeping.

However, the remote field testing method usually requires a relatively large test space. This sets a limitation on a test site, and makes testing inconvenient. In addition, if there is a large batch of antenna apparatuses, it takes much time to test each element in the antenna apparatuses, resulting in low testing efficiency.

SUMMARY

Embodiments of this application provide a phased array correction and testing method and a correction and testing apparatus, to improve test efficiency, reduce a floor area, and lower costs, thereby greatly reducing time required for phased array correction and improving test efficiency of a phased array product.

In view of this, a first aspect of the embodiments of this application provides a phased array correction and testing method. In this method, a correction and testing apparatus including a first phased array and a second phased array is mainly used. The first phased array is a to-be-tested phased array, and specifically, may be a to-be-tested phased array antenna. The second phased array is a mirror array for correction and testing. The first phased array includes at least one first RF (radio frequency) channel, the second phased array includes at least one second RF channel, and a quantity of the second RF channels in the second phased array needs to be greater than or equal to a quantity of the first RF channels, so that a topology of each first RF channel can correspond to a topology of a second RF channel, and the two are in mirror symmetry. In other words, the first RF channel and the $i^{th}$ second RF channel are coupled face to face. The topology herein is a hardware structure, including, for example, a spacing between a first RF channel and a second RF channel, the quantity of the first RF channels, and the quantity of the second RF channels. If the quantity of the second RF channels is greater than the quantity of the first RF channels, there are redundant second RF channels not in mirror symmetry with a first RF channel. It may be understood that a radiation front of the first phased array and a radiation front of the second phased array are spaced by a subwavelength distance. An order of magnitude of a subwavelength is nanometer, and therefore the subwavelength is shorter than a wavelength.

First, the correction and testing apparatus receives, through the second RF channel of the second phased array, a coupling signal sent through the first RF channel of the first phased array; then, may determine an amplitude value and a phase value of the first RF channel based on the coupling signal; and subsequently, calculates, based on the amplitude value, the phase value, and standard metering data, an amplitude deviation value and a phase deviation value that correspond to the first RF channel.

If the calculated amplitude deviation value and the calculated phase deviation value satisfy a preset error condition, that is, if an absolute value of the amplitude deviation value falls within a preset amplitude error range, and an absolute value of the phase deviation value also falls within a preset phase error range, it is determined that the preset error condition is satisfied. In this case, the correction and testing apparatus needs to correct amplitude coefficients and phase coefficients that correspond to all first RF channels, and obtain the corrected target amplitude coefficients and the corrected target phase coefficients.

The correction and testing apparatus may test the first phased array by using the target amplitude coefficient and the target phase coefficient, and obtain performance indicator parameters corresponding to the first phased array, such as an equivalent isotropically radiated power, an error vector amplitude, and a bit error rate.

In the embodiments of this application, the phased array correction and testing method is provided. The method is mainly applied to the correction and testing apparatus. The correction and testing apparatus includes the first phased array and the second phased array. The first phased array includes the first radio frequency RF channel, the second phased array includes the second RF channel, the first RF channel has a correspondence with the second RF channel, and the radiation front of the second phased array and the radiation front of the first phased array are spaced by the subwavelength distance. First, the correction and testing apparatus receives, through the second RF channel, the coupling signal sent through the first RF channel; and then, determines, based on the coupling signal, the amplitude deviation value and the phase deviation value that correspond to the first RF channel. If the amplitude deviation value and the phase deviation value satisfy a preset error correction condition, the correction and testing apparatus needs to correct an amplitude coefficient and a phase coefficient that correspond to the first RF channel to obtain a target amplitude coefficient and a target phase coefficient. Finally, the correction and testing apparatus may measure the performance indicator parameters of the first phased array by using the target amplitude coefficient and the target phase coefficient. In the foregoing manner, a calibrated mirror phased array and a to-be-tested phased array are disposed face to face by a subwavelength distance, and fast amplitude-phase correction is performed on all RF channels of the to-be-tested phased array by using a face-to-face direct coupling mechanism between antenna array elements, thereby improving test efficiency, reducing a floor area, and lowering costs. This can greatly reduce time required for phased array correction and improve test efficiency of a phased array product.

In one embodiment, the first phased array includes a plurality of first RF channels, the second phased array includes a plurality of second RF channels, and the receiving, through the second RF channel of the second phased array, a coupling signal sent through the first RF channel may include the following operations:

After precise correction is strictly performed on the second phased array, the second phased array is mounted on a fixed assembly line test platform as a standard correction and testing device of the first phased array. First, all second RF channels that are in the second phased array of the correction and testing apparatus and that are directly coupled to the first RF channels are in an off state. A matrix of switches performs on-off control on each second RF channel of the second phased array. The matrix of switches includes a plurality of switches, and one switch is connected to one second RF channel. In addition, an attenuator is further provided at each switch, and the attenuator can prevent excessively high power.

Then, the second RF channels may be switched on one by one in a specific order. For example, it is assumed that currently, the first phased array includes nine first RF channels, the second phased array also includes nine second RF channels, and the second RF channels are sequentially numbered 1 to 9. At the beginning, the nine second RF channels are all in an off state. Hence, the No. 1 second RF channel is first switched on, a coupling signal sent through a No. 1 first RF channel that corresponds to the No. 1 second RF channel is received through the No. 1 second RF channel, and then the No. 1 second RF channel is switched off; next, the No. 2 second RF channel is switched on, and a coupling signal sent through a No. 2 first RF channel that corresponds to the No. 2 second RF channel is received through the No. 2 second RF channel; and the process proceeds until coupling signals from the nine first RF channels are all received.

It can be learned that, in this embodiment of this application, first, all the second RF channels corresponding to the first RF channels are switched off; then, these second RF channels are sequentially switched on; and finally, the coupling signal sent through each first RF channel is received through each second RF channel. In the foregoing manner, amplitude-phase correction and measurement can be performed on the to-be-tested phased array in a one-by-one manner, that is, correction and testing can be performed on each first RF channel. Compared with performing correction and testing on a plurality of RF channels simultaneously, this application helps to improve accuracy of correction and testing.

In one embodiment, the receiving, through a second RF channel, a coupling signal sent through each first RF channel may include the following operations:

In one embodiment, in a first operation, when all the second RF channels that are in mirror symmetry to the first RF channels are in the off state, an $n^{th}$ second RF channel in the second RF channels is switched on, where n is a positive integer, and n is not greater than the total quantity of the first RF channels. In a second operation, the correction and testing apparatus receives, through the $n^{th}$ second RF channel, a coupling signal sent through an $n^{th}$ first RF channel. Certainly, the $n^{th}$ second RF channel herein also has a mirror symmetry relationship with the $n^{th}$ first RF channel. After the coupling signal is received, the second RF channel is switched off in a third operation.

The first operation to the third operation may be used to detect any coupling signal sent through a first RF channel in the first phased array, all the first RF channels in the first phased array may send coupling signals by using the foregoing three operations, until the coupling signals sent through the first RF channels are all received through the second RF channels.

It can be learned that, this embodiment of this application describes how the second RF channel receives the coupling signal from the first RF channel. Description is made by using a group of first RF channels and second RF channels corresponding thereto as an example. Amplitude-phase correction and measurement can be performed on the to-be-tested phased array in a one-by-one manner by using a similar method. That is, correction and testing can be performed on each first RF channel. Compared with performing correction and testing on a plurality of RF channels simultaneously, this application helps to improve accuracy of correction and testing.

In one embodiment, the determining, by the correction and testing apparatus based on the coupling signal, an amplitude deviation value and a phase deviation value that correspond to the first RF channel may specifically include the following operations:

First, a vector network analysis instrument in the correction and testing apparatus may detect, based on the obtained coupling signal, the amplitude value and the phase value that correspond to the first RF channel. It may be understood that usually, the amplitude value and the phase value are specific to each first RF channel. However, in actual application, the amplitude value and the phase value may alternatively be specific to a plurality of first RF channels. Description is made by using an amplitude value and a phase value of a first RF channel as an example. However, this does not constitute a limitation on this solution.

After the amplitude value and the phase value of the first RF channel are obtained, the amplitude deviation value and the phase deviation value can be calculated by using a preset amplitude value and a preset phase value respectively. For example, assuming that the preset amplitude value is −20 decibels, the preset phase value is 2 degrees, the amplitude value of the first RF channel is −15 decibels, and the phase value of the first RF channel is 5 degrees, the amplitude deviation value is (−15−(−20))=5, and the phase deviation value is (5−2)=3.

It can be learned that, in the embodiments of this application, the amplitude value and the phase value that correspond to the first RF channel are obtained based on the coupling signal, and then the required amplitude deviation value and the required phase deviation value are calculated by using the preset amplitude value and the preset phase value respectively. In the foregoing manner, deviation values between the currently measured amplitude and phase values and the preset amplitude and phase values can be obtained, and the deviation values are used to determine whether the RF channel has an exception or a fault, thereby helping to improve applicability and operability of the solution.

In one embodiment, after the determining, based on the coupling signal, an amplitude deviation value and a phase deviation value that correspond to the first RF channel, the correction and testing apparatus may further perform the following operations:

The correction and testing apparatus determines whether an absolute value of the amplitude deviation value falls within a preset amplitude error range, and whether an absolute value of the phase deviation value falls within a preset phase error range. If the two conditions are satisfied, the correction and testing apparatus may determine that the amplitude deviation value and the phase deviation value satisfy the preset error correction condition. Using a 9-element antenna as an example, it is assumed that the preset amplitude error range is greater than or equal to 10 decibels, the preset phase error range is greater than or equal to 5 degrees, and amplitude deviation values of nine first RF channels are respectively 12 decibels, 5 decibels, 11 decibels, 10 decibels, 5 decibels, 3 decibels, 7 decibels, 4 decibels, and 19 decibels. Upon comparison, it is found that the largest amplitude deviation value is 19 decibels that is greater than 10 decibels. Therefore, it is determined that the absolute value of the amplitude deviation value falls within the preset amplitude error range. Phase deviation values of the nine first RF channels are respectively 3 degrees, 5 degrees, 8 degrees, 1 degree, 1 degree, 3 degrees, 7 degrees, 10 degrees, and 6 degrees. Upon comparison, it is found that the largest phase deviation value is 10 degrees that is greater than 5 degrees. Therefore, it is determined that the absolute value of the phase deviation value falls within the preset phase error range. In this case, it indicates that the preset error correction condition is currently satisfied.

It can be learned that, in this embodiment of this application, after the amplitude deviation value and the phase deviation value are obtained, whether the absolute value of the amplitude deviation value falls within the preset amplitude error range, and whether the absolute value of the phase deviation value falls within the preset phase error range are further determined. If the absolute value of the amplitude deviation value falls within the preset amplitude error range, and the absolute value of the phase deviation value falls within the preset phase error range, it is determined that the preset error correction condition is satisfied, and subsequent RF channel amplitude-phase correction and testing can be performed. Otherwise, if the preset error correction condition is not satisfied, it is considered that the RF channel has a channel fault, subsequent channel amplitude-phase correction and testing is not performed, and the first phased array is directly disassembled from the second phased array by using a mechanical arm, and returned for corrective maintenance. Therefore, this helps to find whether a fault occurs in the to-be-tested phased array as early as possible, thereby improving applicability of the solution.

In one embodiment, after the determining, based on the coupling signal, an amplitude deviation value and a phase deviation value that correspond to the first RF channel, the correction and testing apparatus may further perform the following operations:

First, the correction and testing apparatus obtains a first position vector of the first RF channel in a space and a second position vector of the second RF channel in the space; then, determines the amplitude coefficient and the phase coefficient based on the first position vector and the second position vector; and finally, calculates, by using a relevant formula, a coupling coefficient based on a near-field electric field generated by the first RF channel, a near-field electric field generated by the second RF channel, the amplitude coefficient, and the phase coefficient.

It can be learned that, in this embodiment of this application, after the amplitude deviation value and the phase deviation value that correspond to the first RF channel are determined, the first position vector and the second position vector may be further obtained, and then the coupling coefficient is calculated based on a series of parameters. In the foregoing manner, a more accurate coupling coefficient can be obtained and is used in subsequent RF channel correction and testing, thereby improving feasibility of the solution.

In one embodiment, the correcting, by the correction and testing apparatus, an amplitude coefficient and a phase coefficient that correspond to the first RF channel to obtain a target amplitude coefficient and a target phase coefficient specifically includes the following operations:

In one embodiment, a front of the first phased array and a front of the second phased array may be kept in parallel, and in this case, the correction and testing apparatus may train the amplitude coefficient and the phase coefficient by using a preset relationship model, where the preset relationship model is a functional relationship model between the coupling coefficient and a parallel deviation position. Then, the correction and testing apparatus can obtain the trained target amplitude coefficient and the trained target phase coefficient.

It can be learned that, this embodiment of this application describes how to obtain the target amplitude coefficient and the target phase coefficient when the first phased array and the second phased array are parallel to each other. That is, the obtained amplitude coefficient and the obtained phase coefficient are trained by using the preset relationship model. In the foregoing manner, the functional relationship model between the coupling coefficient and the parallel deviation position is set up by using an artificial neural network model, and the amplitude coefficient and the phase coefficient are corrected based on measured data by using an artificial intelligence learning algorithm, to obtain the corresponding target amplitude coefficient and the corresponding target phase coefficient, thereby improving correction precision of each first RF channel.

In one embodiment, the front of the first phased array is not parallel to the front of the second phased array, and then the correction and testing apparatus corrects the amplitude coefficient and the phase coefficient that correspond to the first RF channel to obtain the target amplitude coefficient and the target phase coefficient. This operation may include the following operations:

First, the correction and testing apparatus obtains an included angle between the front of the first phased array and the front of the second phased array, and determines how to correct the amplitude coefficient and the phase coefficient based on a value of the included angle.

If the included angle is a small included angle, the correction and testing apparatus may calculate the target amplitude coefficient based on a first amplitude correction coefficient and the amplitude coefficient, and may calculate the target phase coefficient based on a first phase correction coefficient and the phase coefficient, where the first amplitude correction coefficient represents preset amplitude correction coefficients in different directions (for example, an x-axis, a y-axis, and a z-axis), and the first phase correction coefficient represents preset phase correction coefficients in different directions (for example, an x-axis, a y-axis, and a z-axis). Otherwise, if the included angle is a large included angle, the correction and testing apparatus calculates the target amplitude coefficient based on the first amplitude correction coefficient, a second amplitude correction coefficient, and the amplitude coefficient, and calculates the target phase coefficient based on the first phase correction coefficient, a second phase correction coefficient, and the phase coefficient, where the second amplitude correction coefficient represents an amplitude correction coefficient of coupling between the $i^{th}$ first RF channel and the corresponding second RF channel, and the second phase correction coefficient represents a phase correction coefficient of coupling between the $i^{th}$ first RF channel and the corresponding second RF channel.

It can be learned that, this embodiment of this application describes how to obtain the target amplitude coefficient and the target phase coefficient when the first phased array and the second phased array are not parallel to each other. That is, an included angle between the front of the first phased array and the front of the second phased array is obtained first, and a corresponding correction manner is selected based on a type of the included angle. In the foregoing manner, the amplitude coefficient and the phase coefficient are corrected based on measured data by using the amplitude correction coefficient and the phase correction coefficient, to obtain the corresponding target amplitude coefficient and the corresponding target phase coefficient, thereby improving correction precision of each first RF channel.

In one embodiment, after obtaining the target amplitude coefficient and the target phase coefficient, the correction and testing apparatus may further perform the following operation:

The correction and testing apparatus may further determine a beam directivity pattern of the first phased array based on the target amplitude coefficient and the target phase coefficient.

A beam means a shape formed on the surface of the earth by an electromagnetic wave emitted by a satellite antenna, and mainly includes a global beam, a dot-shaped beam, and a shaped beam. Their shapes depend on a transmit antenna. The beam directivity pattern may include a horizontal beam width and a vertical beam width.

A beam width may be an included angle between two half-power points of a beam, and is related to an antenna gain. Generally, a higher antenna gain means a narrower beam and a higher search angle resolution. The horizontal beam width means an included angle between two directions in which a radiated power is reduced by 3 decibels on both sides of a maximum radiation direction in a horizontal direction. The vertical beam width means an included angle between two directions in which a radiated power is reduced by 3 dB on both sides of a maximum radiation direction in a vertical direction.

It can be learned that, in this embodiment of this application, after all the RF channels of the first phased array are corrected, not only a backend processing device of the second phased array can be used to perform online monitoring on the performance indicator parameters of the first phased array, but also the target phase coefficient and the target amplitude coefficient can be used to determine the beam directivity pattern corresponding to the first phased array, to predict the beam directivity pattern of the to-be-tested phased array, thereby improving applicability of the solution.

In one embodiment, before the receiving, through the second RF channel, a coupling signal sent through the first RF channel, the correction and testing apparatus may further perform the following operations:

When a transmission amplitude value of the second RF channel is largest, the correction and testing apparatus determines corresponding positions of the first phased array and the second phased array. Specifically, a test instrument performs a peak search in x-axis and y-axis dimensions, where the x-axis and the y-axis are respectively a horizontal axis and a vertical axis. Transmission amplitude values corresponding to the second phased array at different coordinate positions are obtained through the peak search, where the coordinate positions are positions on the x-axis and the y-axis. In a feasible manner, when transmission amplitude values of all second RF channels are largest, it may be considered that the front of the first phased array is aligned with the front of the second phased array, and subsequent phased array correction and testing can be continued.

It can be learned that, in this embodiment of this application, after the coupling signal sent through the first RF channel is received through the second RF channel, positions of the first phased array and the second phased array need to be further adjusted, and when the positions are adjusted to optimal positions, the transmission amplitude value of the second RF channel should be largest. In the foregoing manner, optimal position points of the first phased array and the second phased array can be found by using a physical position search method, and correction and testing is performed based on the optimal position points, thereby achieving a more accurate and efficient correction and testing effect.

A second aspect of the embodiments of this application provides a correction and testing apparatus. The correction and testing apparatus may include a first phased array, a second phased array, and a test instrument. The first phased array is a to-be-tested phased array, and specifically, may be a to-be-tested phased array antenna. The second phased array is a mirror array for correction and testing. The first phased array includes at least one first RF channel, and the second phased array includes at least one second RF channel. A quantity of the second RF channels in the second phased array needs to be greater than or equal to a quantity of the first RF channels, so that each first RF channel can correspond to a second RF channel. In other words, the first RF channel and the second RF channel are coupled face to face. A radiation front of the first phased array and a radiation front of the second phased array are spaced by a subwavelength distance. An order of magnitude of a subwavelength is nanometer, and therefore the subwavelength is shorter than a wavelength.

The second phased array in the correction and testing apparatus may receive, through the second RF channel of the second phased array, a coupling signal sent through the first RF channel of the first phased array.

The test instrument is configured to determine an amplitude value and a phase value of the first RF channel based on the coupling signal, and calculate, based on the amplitude value, the phase value, and standard metering data, an amplitude deviation value and a phase deviation value that correspond to the first RF channel.

If the amplitude deviation value and the phase deviation value satisfy a preset error correction condition, that is, if an absolute value of the amplitude deviation value falls within a preset amplitude error range, and an absolute value of the phase deviation value also falls within a preset phase error range, it is determined that the preset error condition is satisfied. In this case, the test instrument is configured to correct amplitude coefficients and phase coefficients that correspond to all first RF channels, and obtain the corrected target amplitude coefficients and the corrected target phase coefficients.

The test instrument is configured to test the first phased array based on the target amplitude coefficient and the target phase coefficient, and obtain performance indicator parameters corresponding to the first phased array, such as an equivalent isotropically radiated power, an error vector amplitude, and a bit error rate.

In this embodiment of this application, a calibrated mirror phased array and a to-be-tested phased array are disposed face to face by a subwavelength distance, and fast amplitude-phase correction is performed on all RF channels of the to-be-tested phased array by using a face-to-face direct coupling mechanism between antenna array elements, thereby improving test efficiency, reducing a floor area, and lowering costs. This can greatly reduce time required for phased array correction and improve test efficiency of a phased array product.

In one embodiment, the first phased array includes a plurality of first RF channels, the second phased array includes a plurality of second RF channels, the second phased array further includes a plurality of switches and a plurality of attenuators, where each switch is connected to each second RF channel, and each attenuator is connected to each second RF channel.

When the plurality of second RF channels are in an off state, the switches are configured to switch on a target second RF channel in the plurality of second RF channels, where the target second RF channel is any second RF channel in the plurality of second RF channels.

The second RF channels are configured to receive, through the target second RF channel, a coupling signal sent through a target first RF channel, until coupling signals sent through the plurality of first RF channels are all received, where the target first RF channel is a first RF channel in the plurality of first RF channels that has a mirror symmetry relationship with the target second RF channel.

Each attenuator is configured to perform signal attenuation processing on the coupling signal.

After precise correction is strictly performed on the second phased array, the second phased array is mounted on a fixed assembly line test platform as a standard correction and testing device of the first phased array. First, a matrix of switches (a matrix including a plurality of switches) is used to set all second RF channels that are in the second phased array and that are directly coupled to the first RF channels to an off state. The matrix of switches performs on-off control on each second RF channel of the second phased array. The matrix of switches includes a plurality of switches, and one switch is connected to one second RF channel. In addition, an attenuator is further provided at each switch, and the attenuator can prevent excessively high power.

Then, the second RF channels may be switched on one by one in a specific order. For example, it is assumed that currently, the first phased array includes nine first RF channels, the second phased array also includes nine second RF channels, and the second RF channels are sequentially numbered 1 to 9. At the beginning, the nine second RF channels are all in an off state. Hence, the No. 1 second RF channel is first switched on, a coupling signal sent through a No. 1 first RF channel that corresponds to the No. 1 second RF channel is received through the No. 1 second RF channel, and then the No. 1 second RF channel is switched off; next, the No. 2 second RF channel is switched on, and a coupling signal sent through a No. 2 first RF channel that corresponds to the No. 2 second RF channel is received through the No. 2 second RF channel; and the process proceeds until coupling signals from the nine first RF channels are all received.

It can be learned that, in this embodiment of this application, first, all the second RF channels corresponding to the first RF channels are switched off; then, these second RF channels are sequentially switched on; and finally, the coupling signal sent through each first RF channel is received through each second RF channel. In the foregoing manner, amplitude-phase correction and measurement can be performed on the to-be-tested phased array in a one-by-one manner, that is, correction and testing can be performed on each first RF channel. Compared with performing correction and testing on a plurality of RF channels simultaneously, this application helps to improve accuracy of correction and testing.

In one embodiment, the switches and the second RF channels may receive, by performing the following operations, the coupling signal sent through each first RF channels:

(1) The switch is specifically configured to: when the plurality of second RF channels are in the off state, switch on an $n^{th}$ second RF channel in the plurality of second RF channels, where n is a positive integer.

(2) The second RF channel is specifically used to receive, through the $n^{th}$ second RF channel, a coupling signal sent through an $n^{th}$ first RF channel, where the $n^{th}$ second RF channel has a mirror symmetry relationship with the $n^{th}$ first RF channel.

(3) The switch is specifically configured to switch off the $n^{th}$ second RF channel.

The switches and the second RF channels are configured to separately perform operations of (1) to (3) on the plurality of second RF channels having a mirror symmetry relationship with the plurality of first RF channels, until the coupling signals sent through the plurality of first RF channels are all received by the plurality of second RF channels.

It can be learned that, this embodiment of this application describes how the second RF channel receives the coupling signal from the first RF channel. Description is made by using a group of first RF channels and second RF channels corresponding thereto as an example. Amplitude-phase correction and measurement can be performed on the to-be-tested phased array in a one-by-one manner by using a similar method. That is, correction and testing can be performed on each first RF channel. Compared with performing correction and testing on a plurality of RF channels simultaneously, this application helps to improve accuracy of correction and testing.

In one embodiment, the test instrument may include a vector network analysis instrument. The vector network analysis instrument is mainly configured to determine, based on the coupling signal, an amplitude value and a phase value that correspond to the first RF channel, and then calculate, based on the amplitude value and a preset amplitude value, the amplitude deviation value corresponding to the first RF channel. In addition, the vector network analysis instrument is further configured to calculate, based on the phase value and a preset phase value, the phase deviation value corresponding to the first RF channel.

First, the vector network analysis instrument may detect, based on the obtained coupling signal, the amplitude value and the phase value that correspond to the first RF channel. It may be understood that usually, the amplitude value and the phase value are specific to each first RF channel. However, in actual application, the amplitude value and the phase value may alternatively be specific to a plurality of first RF channels. Description is made by using an amplitude value and a phase value of a first RF channel as an example. However, this does not constitute a limitation on this solution.

After the amplitude value and the phase value of the first RF channel are obtained, an amplitude deviation value and a phase deviation value can be calculated by using a preset amplitude value and a preset phase value respectively. For example, assuming that the preset amplitude value is −20 decibels, the preset phase value is 2 degrees, the amplitude value of the first RF channel is −15 decibels, and the phase value of the first RF channel is 5 degrees, the amplitude deviation value is (−15−(−20))=5, and the phase deviation value is (5−2)=3.

It can be learned that, in this embodiment of this application, the amplitude value and the phase value that correspond to the first RF channel are obtained based on the coupling signal, and then the required amplitude deviation value and the required phase deviation value are calculated by using the preset amplitude value and the preset phase value respectively. In the foregoing manner, deviation values between the currently measured amplitude and phase values and the preset amplitude and phase values can be obtained, and the deviation values are used to determine whether the RF channel has an exception or a fault, thereby helping to improve applicability and operability of the solution.

In one embodiment, the test instrument includes a test control device.

The test control device is configured to determine whether an absolute value of the amplitude deviation value falls within a preset amplitude error range, and whether an absolute value of the phase deviation value falls within a preset phase error range. If the two conditions are both satisfied, the test control device may determine that the amplitude deviation value and the phase deviation value satisfy the preset error correction condition.

Using a 9-element antenna as an example, it is assumed that the preset amplitude error range is greater than or equal to 10 decibels, the preset phase error range is greater than or equal to 5 degrees, and amplitude deviation values of nine first RF channels are respectively 12 decibels, 5 decibels, 11 decibels, 10 decibels, 5 decibels, 3 decibels, 7 decibels, 4 decibels, and 19 decibels. Upon comparison, it is found that the largest amplitude deviation value is 19 decibels that is greater than 10 decibels. Therefore, it is determined that the absolute value of the amplitude deviation value falls within the preset amplitude error range. Phase deviation values of the nine first RF channels are respectively 3 degrees, 5 degrees, 8 degrees, 1 degree, 1 degree, 3 degrees, 7 degrees, 10 degrees, and 6 degrees. Upon comparison, it is found that the largest phase deviation value is 10 degrees that is greater than 5 degrees. Therefore, it is determined that the absolute value of the phase deviation value falls within the preset phase error range. In this case, it indicates that the preset error correction condition is currently satisfied.

It can be learned that, in this embodiment of this application, after the amplitude deviation value and the phase deviation value are obtained, whether the absolute value of the amplitude deviation value falls within the preset amplitude error range, and whether the absolute value of the phase deviation value falls within the preset phase error range are further determined. If the absolute value of the amplitude deviation value falls within the preset amplitude error range, and the absolute value of the phase deviation value falls within the preset phase error range, it is determined that the preset error correction condition is satisfied, and subsequent RF channel amplitude-phase correction and testing can be performed. Otherwise, if the preset error correction condition is not satisfied, it is considered that the RF channel has a channel fault, subsequent channel amplitude-phase correction and testing is not performed, and the first phased array is directly disassembled from the second phased array by using a mechanical arm, and returned for corrective maintenance. Therefore, this helps to find whether a fault occurs in the to-be-tested phased array as early as possible, thereby improving applicability of the solution.

In one embodiment, the test instrument is further configured to obtain a first position vector of the first RF channel in a space and a second position vector of the second RF channel in the space; then, the test instrument determines the amplitude coefficient and the phase coefficient based on the first position vector and the second position vector; and finally, the test instrument calculates a coupling coefficient based on a near-field electric field generated by the first RF channel, a near-field electric field generated by the second RF channel, the amplitude coefficient, and the phase coefficient.

It can be learned that, in this embodiment of this application, after the amplitude deviation value and the phase deviation value that correspond to the first RF channel are determined, the first position vector and the second position vector may be further obtained, and then, the coupling coefficient is calculated based on a series of parameters. In the foregoing manner, a more accurate coupling coefficient can be obtained and is used in subsequent RF channel correction and testing, thereby improving feasibility of the solution.

In one embodiment, a front of the first phased array and a front of the second phased array may be kept in parallel, and the test instrument is specifically configured to train the amplitude coefficient and the phase coefficient by using a preset relationship model, and then obtain the trained target amplitude coefficient and the trained target phase coefficient, where the preset relationship model is a functional relationship model between the coupling coefficient and a parallel deviation position.

It can be learned that, this embodiment of this application describes how to obtain the target amplitude coefficient and the target phase coefficient when the first phased array and the second phased array are parallel to each other. That is, the obtained amplitude coefficient and the obtained phase coefficient are trained by using the preset relationship model. In the foregoing manner, the functional relationship model between the coupling coefficient and the parallel deviation position is set up by using an artificial neural network model, and the amplitude coefficient and the phase coefficient are corrected based on measured data by using an artificial intelligence learning algorithm, to obtain the corresponding target amplitude coefficient and the corresponding target phase coefficient, thereby improving correction precision of each first RF channel.

In one embodiment, the front of the first phased array is not parallel to the front of the second phased array, and then the test instrument is specifically configured to obtain an included angle between the front of the first phased array and the front of the second phased array.

If the included angle is a small included angle, the test instrument may calculate the target amplitude coefficient based on a first amplitude correction coefficient and the amplitude coefficient, and may calculate the target phase coefficient based on a first phase correction coefficient and the phase coefficient, where the first amplitude correction coefficient represents preset amplitude correction coefficients in different directions (for example, an x-axis, a y-axis, and a z-axis), and the first phase correction coefficient represents preset phase correction coefficients in different directions (for example, an x-axis, a y-axis, and a z-axis). Otherwise, if the included angle is a large included angle, the test instrument calculates the target amplitude coefficient based on the first amplitude correction coefficient, a second amplitude correction coefficient, and the amplitude coefficient, and calculates the target phase coefficient based on the first phase correction coefficient, a second phase correction coefficient, and the phase coefficient, where the second amplitude correction coefficient represents an amplitude correction coefficient of coupling between the $i^{th}$ first RF channel and the corresponding second RF channel, and the second phase correction coefficient represents a phase correction coefficient of coupling between the $i^{th}$ first RF channel and the corresponding second RF channel.

It can be learned that, this embodiment of this application describes how to obtain the target amplitude coefficient and the target phase coefficient when the first phased array and the second phased array are not parallel to each other. That is, an included angle between the front of the first phased array and the front of the second phased array is obtained first, and a corresponding correction manner is selected based on a type of the included angle. In the foregoing manner, the amplitude coefficient and the phase coefficient are corrected based on measured data by using the amplitude correction coefficient and the phase correction coefficient, to obtain the corresponding target amplitude coefficient and the corresponding target phase coefficient, thereby improving correction precision of each first RF channel.

In one embodiment, after obtaining the target amplitude coefficient and the target phase coefficient, the correction and testing apparatus may further perform the following operation:

The correction and testing apparatus may further determine a beam directivity pattern of the first phased array based on the target amplitude coefficient and the target phase coefficient.

A beam means a shape formed on the surface of the earth by an electromagnetic wave emitted by a satellite antenna, and mainly includes a global beam, a dot-shaped beam, and a shaped beam. Their shapes depend on a transmit antenna. The beam directivity pattern may include a horizontal beam width and a vertical beam width.

A beam width may mean an included angle between two half-power points of the beam, and is related to an antenna gain. Generally, a higher antenna gain means a narrower beam and a higher search angle resolution. The horizontal beam width means an included angle between two directions in which a radiated power is reduced by 3 decibels on both sides of a maximum radiation direction in a horizontal direction. The vertical beam width means an included angle between two directions in which a radiated power is reduced by 3 dB on both sides of a maximum radiation direction in a vertical direction.

It can be learned that, in the embodiments of this application, after all the RF channels of the first phased array are corrected, not only a backend processing device of the second phased array can be used to perform online monitoring on the performance indicator parameters of the first phased array, but also the target phase coefficient and the target amplitude coefficient can be used to determine the beam directivity pattern corresponding to the first phased array, to predict the beam directivity pattern of the to-be-tested phased array, thereby improving applicability of the solution.

In one embodiment, when a transmission amplitude value of the second RF channel is largest, the test instrument is further configured to determine corresponding positions of the first phased array and the second phased array.

Specifically, first, the test instrument performs a peak search in x-axis and y-axis dimensions, where the x-axis and the y-axis are respectively a horizontal axis and a vertical axis. Transmission amplitude values corresponding to the second phased array at different coordinate positions are obtained through the peak search, where the coordinate positions are positions on the x-axis and the y-axis. In a feasible manner, when transmission amplitude values of all second RF channels are largest, it may be considered that the front of the first phased array is aligned with the front of the second phased array, and subsequent phased array correction and testing can be continued.

It can be learned that, in this embodiment of this application, after the coupling signal sent through the first RF channel is received through the second RF channel, positions of the first phased array and the second phased array need to be further adjusted, and when the positions are adjusted to optimal positions, the transmission amplitude value of the second RF channel should be largest. In the foregoing manner, optimal position points of the first phased array and the second phased array can be found by using a physical position search method, and correction and testing is performed based on the optimal position points, thereby achieving a more accurate and efficient correction and testing effect.

According to a third aspect, an embodiment of this application provides a computer device, including: a processor, a memory, a bus, and a communications bus. The memory is configured to store computer executable instructions, and the processor is connected to the memory through the bus. When the server runs, the processor executes the computer executable instructions stored in the memory, so that the server performs the method according to any one of the foregoing aspects.

According to a fourth aspect, an embodiment of this application provides a computer-readable storage medium, configured to store computer software instructions used for the foregoing method. When the computer software instructions are run on a computer, the computer is enabled to perform the method according to any one of the foregoing aspects.

According to a fifth aspect, an embodiment of this application provides a computer program product including instructions. When the instructions are run on a computer, the computer is enabled to perform the method according to any one of the foregoing aspects.

In addition, for technical effects brought by any design manner in the third aspect and the fifth aspect, refer to the technical effects brought by different design manners in the first aspect. Details are not described herein again.

It can be learned from the foregoing technical solutions that the embodiments of this application have the following advantages:

In the embodiments of this application, the phased array correction and testing method is provided. The method is mainly applied to the correction and testing apparatus. The correction and testing apparatus includes the first phased array and the second phased array. The first phased array includes the first radio frequency RF channel, the second phased array includes the second RF channel, the first RF channel has a correspondence with the second RF channel, and the radiation front of the second phased array and the radiation front of the first phased array are spaced by the subwavelength distance. First, the correction and testing apparatus receives, through the second RF channel, the coupling signal sent through the first RF channel; and then, determines, based on the coupling signal, the amplitude deviation value and the phase deviation value that correspond to the first RF channel. If the amplitude deviation value and the phase deviation value satisfy the preset error correction condition, the correction and testing apparatus needs to correct the amplitude deviation value and the phase deviation value that correspond to the first RF channel to obtain the target amplitude coefficient and the target phase coefficient. Finally, the correction and testing apparatus may measure the performance indicator parameters of the first phased array by using the target amplitude coefficient and the target phase coefficient. In the foregoing manner, a calibrated mirror phased array and a to-be-tested phased array are disposed face to face by a subwavelength distance, and fast amplitude-phase correction is performed on all RF channels of the to-be-tested phased array by using a face-to-face direct coupling mechanism between antenna array elements, thereby improving test efficiency, reducing a floor area, and lowering costs. This can greatly reduce time required for phased array correction and improve test efficiency of a phased array product.

BRIEF DESCRIPTION OF DRAWINGS

To describe the technical solutions in the embodiments of this application more clearly, the following briefly describes the accompanying drawings required for describing the embodiments. Apparently, the accompanying drawings in the following description show merely some embodiments of this application.

DESCRIPTION OF EMBODIMENTS

Figure 1:
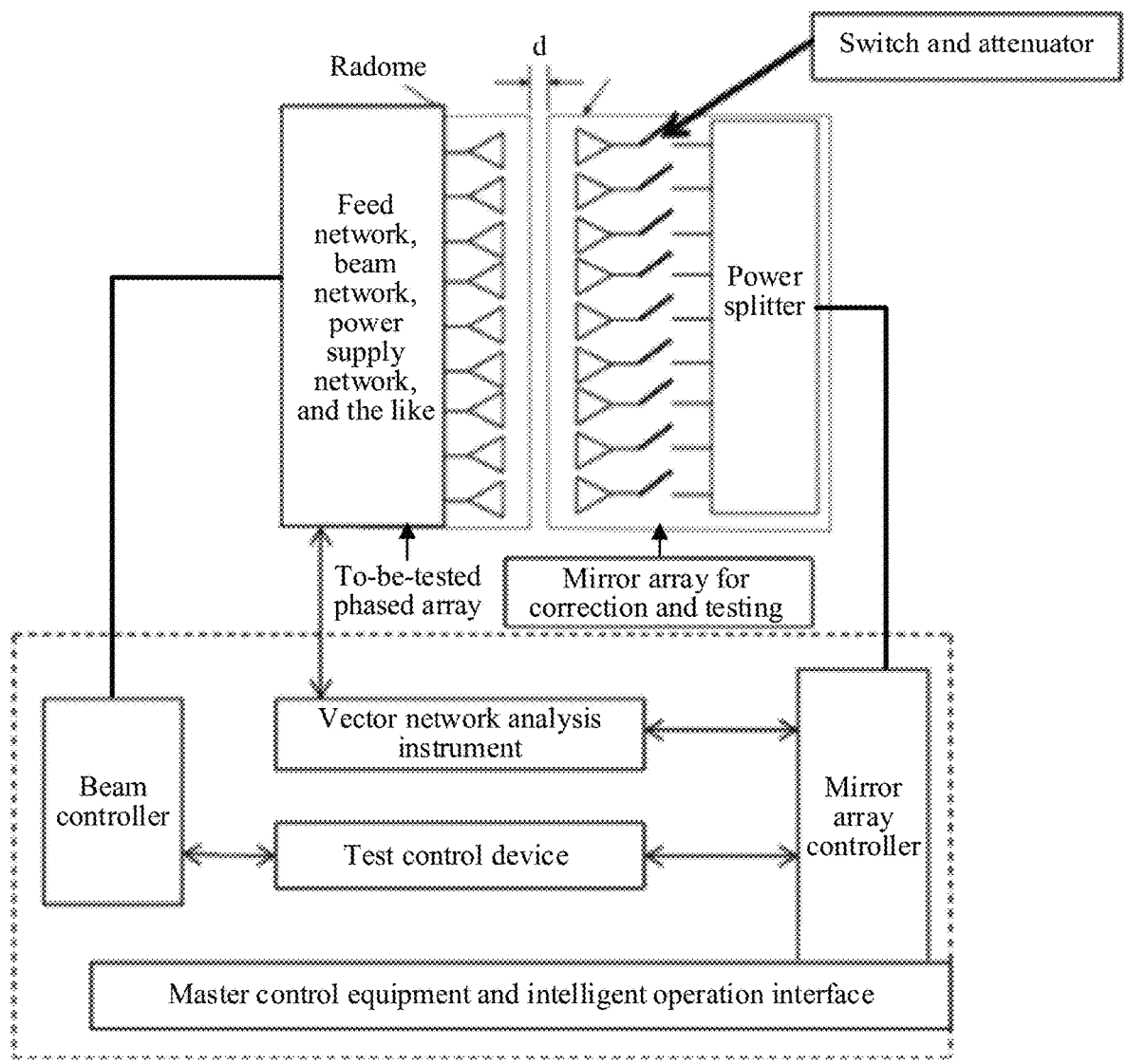
FIG. 1 is a schematic structural diagram of a correction and testing apparatus according to an embodiment of this application.

Embodiments of this application provide a phased array correction and testing method and a correction and testing apparatus, to improve test efficiency, reduce a floor area, and lower costs, thereby greatly reducing time required for phased array correction and improving test efficiency of a phased array product.

In the specification, claims, and accompanying drawings of this application, the terms "first", "second", "third", "fourth", and so on (if existent) are intended to distinguish between similar objects but do not necessarily indicate a specific order or sequence. It should be understood that the data termed in such a way are interchangeable in proper circumstances so that the embodiments of this application described herein can be implemented in orders except the order illustrated or described herein. Moreover, the terms "include", "contain" and any other variants mean to cover the non-exclusive inclusion, for example, a process, method, system, product, or device that includes a list of operations or units is not necessarily limited to those units, but may include other units not expressly listed or inherent to such a process, method, system, product, or device.

It should be understood that this application may be applied to a scenario of fast correcting a phased array antenna product. A phased array antenna is a most important antenna form in a current satellite mobile communications system, and includes three parts: an antenna array, a feed network, and a beam controller. A basic principle is that: after receiving control information including a communication direction, a microprocessor calculates a phase shift of each phase shifter according to an algorithm provided by control software; and then controls, by using an antenna controller, the feed network to complete a phase shifting process. Because phase shifting can compensate for a difference of time at which a same signal arrives at different array elements, in this case, output in-phase superposition of the antenna array reaches a maximum. Once a signal direction changes, a maximum pointing range of a beam of the antenna array may be correspondingly changed by only adjusting the phase shift of the phase shifter, thereby implementing beam scanning and tracking. The phased array antenna includes: a phased scanning line antenna array and a planar phased array antenna.

A phased array is widely applied to fields of fast tracking radars, phase measurement, and the like, and may enable pointing of a main lobe to be adjusted with a requirement of communication. An antenna in a shape of a directivity pattern is changed by controlling a feed phase of a radiation unit in an array antenna. Pointing of a maximum value of the directivity pattern of the antenna may be changed by controlling the phase, to implement beam sweeping. In a special case, a level of a side lobe, a minimum value position of the side lobe, and a shape of a whole directivity pattern may also be controlled. When an antenna rotates mechanically, inertia is large, and a speed is low. The phased array antenna overcomes such a disadvantage, and beam scanning is fast. A feed phase of the phased array antenna is usually controlled by an electronic computer (that is, master control equipment), and the phase changes fast. That is, the pointing of the maximum value of the directivity pattern of the antenna or another parameter changes fast. This is the most significant feature of the phased array antenna.

For ease of description, refer to FIG. 1. FIG. 1 is a schematic structural diagram of a correction and testing apparatus according to an embodiment of this application. As shown in the figure, this application provides a correction and testing apparatus based on a mirror direct coupling at a subwavelength spacing. As the name implies, the correction and testing apparatus no longer uses any one of a feeder coupling mechanism, a near-field scanning mechanism, and a far-field rotation vector method to perform amplitude-phase correction of a phased array channel, but uses a calibrated mirror phased array. The mirror phased array and a to-be-tested phased array are disposed face to face by a subwavelength distance, to implement fast amplitude-phase correction on all channels of the to-be-tested phased array by using a face-to-face direct coupling mechanism between antenna array elements.

In FIG. 1, a structure and a function of a mirror array for correction and testing are consistent with a structure and a function of the to-be-tested phased array. To facilitate amplitude-phase correction on each radio frequency (RF) channel in a one-by-one manner, a matrix of switches controls each RF channel. If switches of all RF channels of the mirror array for correction and testing are simultaneously connected to receive channels, synchronous amplitude-phase correction of all the RF channels can be completed within several seconds. In a correction and testing process, the to-be-tested phased array and the mirror array for correction and testing can be accurately spatially docked, assembled, and disassembled by a mechanical arm through a precise positioning hole apparatus that is normatively designed in advance. In addition, the beam controller in FIG. 1 is configured to control beam pointing and a beam shape of the to-be-tested phased array, and a mirror array controller is configured to control beam pointing and a beam shape of the mirror array for correction and testing.

From a perspective of a near or far field, a super near-field phased array correction method is used in this application. From a perspective of a working mechanism, an electromagnetic resonant coupling mechanism is used in this application. That is, amplitude-phase correction of a channel is performed by using information of a direct coupling resonant signal between array elements adjoined face to face, not by measuring near-field, mid-field, or far-field spatial electromagnetic field information with an electromagnetic probe. In this application, near-field scanning is not required, and a precise electromagnetic probe and an electromagnetic darkroom environment with high costs are not required, either. Therefore, a correction speed is high, test efficiency is high, a floor area is small, and costs are low, and phased array products can be corrected and tested online in batches, so that time required for phased array correction is greatly reduced, and test efficiency of the phased array products is improved. This application is particularly suitable for correction and testing of phased array products in a large batch.

It can be understood that in this application, each RF channel and an active device in the RF channel may both be matched based on a test scenario.

A matching manner of each RF channel in the test scenario is as follows: Assuming that a to-be-tested phased array is a 9-element antenna (that is, including nine RF channels), nine RF channels in a mirror array for correction and testing need to be matched with nine RF channels in the to-be-tested phased array for testing.

A matching manner of an active device in each RF channel in the test scenario is as follows: If a to-be-tested phased array is in a signal transmit scenario, an output power may be controlled by controlling the active device in the to-be-tested phased array, and the output power may be greater than or equal to 0 dBm. If a mirror array for correction and testing is in a signal receive scenario, an input power may be controlled by adjusting an active device in the mirror array for correction and testing, and the input power may be greater than or equal to −130 dBm and is less than or equal to 0 dBm.

It needs to be noted that the active device includes, but is not limited to, a power amplifier, an integrated voltage regulator, a comparator, and a waveform generator. This is not limited herein.

Figure 2:
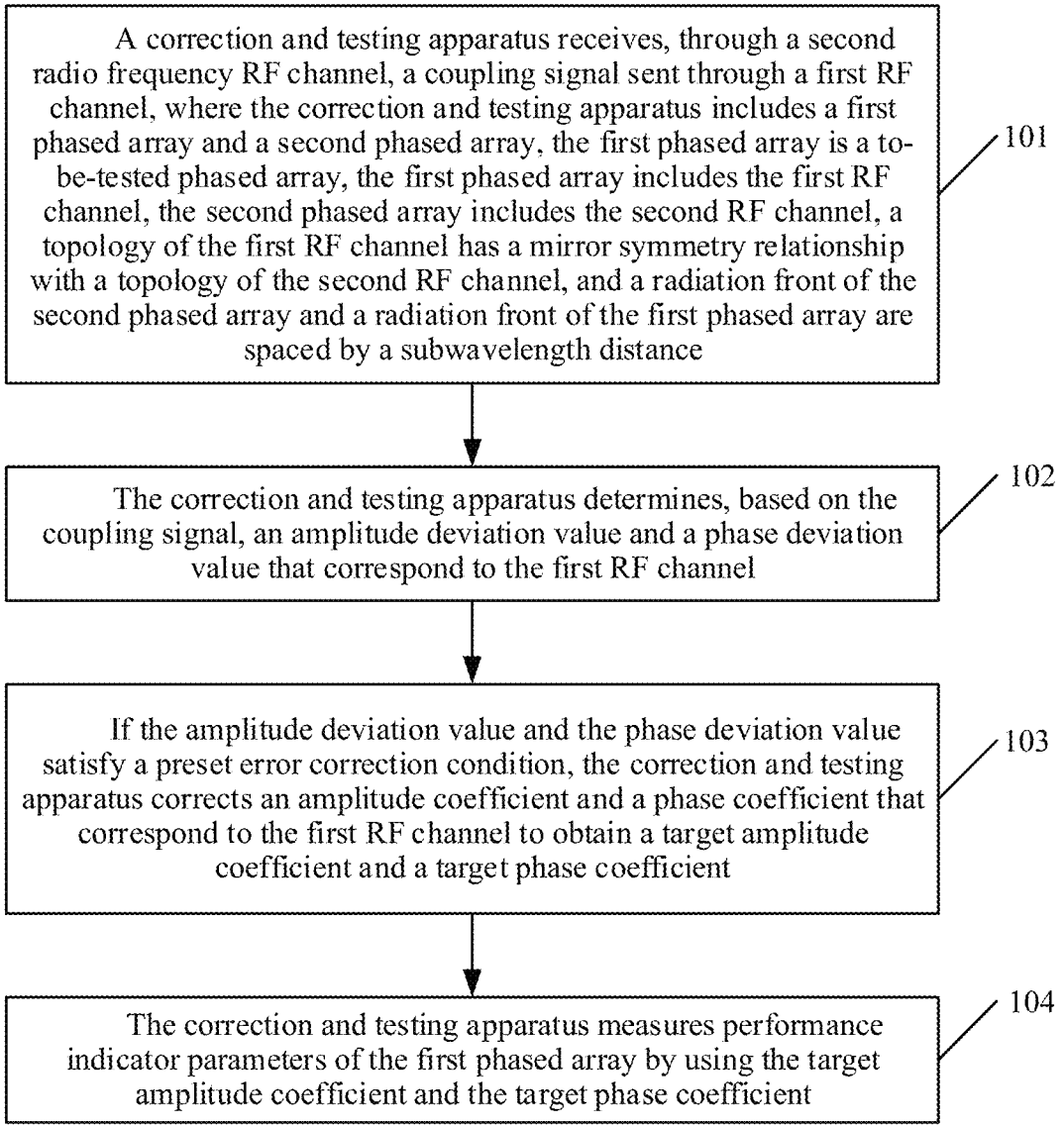
FIG. 2 is a schematic diagram of an embodiment of a phased array correction and testing method according to an embodiment of this application.

Referring to FIG. 2, an embodiment of the phased array correction and testing method in the embodiments of this application includes the following operations.

Operation 101: A correction and testing apparatus receives, through a second radio frequency RF channel, a coupling signal sent through a first RF channel, where the correction and testing apparatus includes a first phased array and a second phased array, the first phased array is a to-be-tested phased array, the first phased array includes the first RF channel, the second phased array includes the second RF channel, a topology of the first RF channel has a mirror symmetry relationship with a topology of the second RF channel, and a radiation front of the second phased array and a radiation front of the first phased array are spaced by a subwavelength distance.

In this embodiment, the correction and testing apparatus including the first phased array and the second phased array is used. The first phased array is a to-be-tested phased array, and specifically, may be a to-be-tested phased array antenna. The second phased array is a mirror array for correction and testing. The first phased array includes at least one first RF channel, and the second phased array includes at least one second RF channel. A quantity of the second RF channels in the second phased array needs to be greater than or equal to a quantity of the first RF channels, so that each first RF channel can correspond to a second RF channel, that is, the first RF channel and the second RF channel are coupled face to face. The radiation front of the first phased array and the radiation front of the second phased array are spaced by the subwavelength distance. Typically, an order of magnitude of a wavelength is micron, an order of magnitude of the subwavelength is nanometer, and therefore the subwavelength is shorter than the wavelength. The topology of the first RF channel has a correspondence with a topology of the second RF channel. The topology herein is a hardware structure, including, for example, a spacing between a first RF channel and a second RF channel, the quantity of the first RF channels, and the quantity of the second RF channels. However, the topology does not include a spacing between active devices and a quantity of the active devices. For example, an attenuator is deployed on the second RF channel, and an attenuator does not need to be deployed on the first RF channel. For example, an amplifier is deployed on the first RF channel, and an amplifier does not need to be deployed on the second RF channel.

Figure 3:
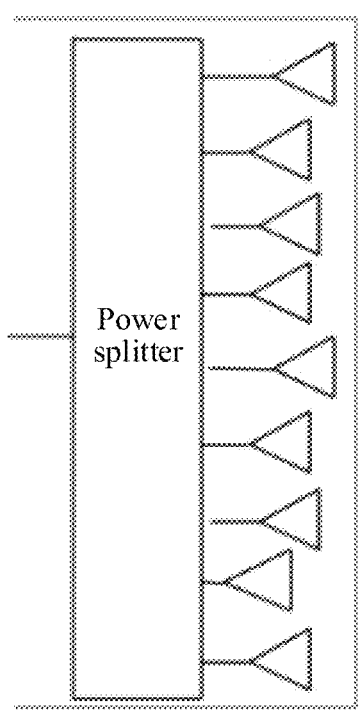
FIG. 3 is a schematic structural diagram of a second phased array according to an embodiment of this application.

In one embodiment, a second phased array having a quantity of channel elements greater than or equal to that of a first phased array is constructed in advance. FIG. 3 is a schematic structural diagram of the second phased array according to an embodiment of this application. As shown in the figure, assuming that the second phased array includes a 9-element antenna array, the 9-element antenna array is connected to a power splitter, and energy of one input signal is split by the power splitter into a plurality of signals that are equal or not equal for output. In addition, energy of a plurality of signals may alternatively be combined into one for output. A specific degree of isolation should be ensured between output ports of a power splitter.

After precise correction is strictly performed on the second phased array, the second phased array is mounted on a fixed assembly line test platform as a standard correction and testing device of the first phased array. A matrix of switches performs on-off control on each second RF channel of the second phased array.

More specifically, each time a coupling signal sent through a first RF channel is detected, the following steps may be performed:

In a first operation, when all the second RF channels that are in mirror symmetry to the first RF channels are in an off state, an $n^{th}$ second RF channel in the second RF channels is switched on, where n is a positive integer, and n is not greater than the total quantity of the first RF channels. In a second operation, the correction and testing apparatus receives, through the $n^{th}$ second RF channel, a coupling signal sent through an $n^{th}$ first RF channel. Certainly, the $n^{th}$ second RF channel herein also has a mirror symmetry relationship with the $n^{th}$ first RF channel. After the coupling signal is received, the second RF channel is switched off in a third operation.

The first operation to the third operation may be used to detect any coupling signal sent through a first RF channel in the first phased array. All the first RF channels in the first phased array may send coupling signals by using the foregoing three steps, until the coupling signals sent through the first RF channels are all received through the second RF channels.

For example, the first phased array includes nine first RF channels, and the second phased array includes 20 second RF channels. The 20 second RF channels are sequentially numbered 1 to 20. However, second RF channels having a mirror symmetry relationship with the first RF channels are sequentially numbered 1 to 9. At the beginning, the nine second RF channels are all in an off state. Hence, the No. 1 second RF channel is first switched on, a coupling signal sent through the No. 1 first RF channel that corresponds to the No. 1 second RF channel is received through the No. 1 second RF channel, and then the No. 1 second RF channel is switched off; next, the No. 2 second RF channel is switched on, a coupling signal sent through the No. 2 first RF channel that corresponds to the No. 2 second RF channel is received through the No. 2 second RF channel; and the process proceeds until coupling signals from the nine first RF channels are all received.

It may be understood that in actual application, the second RF channel may not receive coupling signals in a fixed order.

Operation 102: The correction and testing apparatus determines, based on the coupling signal, an amplitude deviation value and a phase deviation value that correspond to the first RF channel.

In this embodiment, the correction and testing apparatus first determines, based on the coupling signal transmitted from the first phased array, an amplitude value and a phase value that correspond to each first RF channel; and then calculates, based on standard metering data, an amplitude deviation value and a phase deviation value that correspond to the first RF channel.

In one embodiment, a radome front of the second phased array is used as a phase reference plane, standard metering data corresponding to each second RF channel of the second phased array is used as a measurement reference, and a multi-RF channel vector network analyzer is used to perform amplitude-phase measurement on a channel of the first phased array. It is assumed that standard metering data corresponding to the first RF channel is denoted as $a_i^{ref}$, $\phi_i^{ref}$, i=1, 2, ..., N, where i represents an $i^{th}$ first RF channel, N represents a quantity of first RF channels, $a_i^{ref}$ represents a preset amplitude value of the $i^{th}$ first RF channel, and $\phi_i^{ref}$ represents a preset phase value of the $i^{th}$ first RF channel. In a mode of correcting RF channels one by one, the matrix of switches performs on-off switching on the switches of the second RF channels in the second phased array sequentially based on numbers of the second RF channels, to perform amplitude-phase measurement and correction on the first RF channels of the first phased array one by one.

In a mode of synchronously correcting all channels, the matrix of switches sets the switches of all the second RF channels in the second phased array to a channel receiving state, and then, synchronously measures and records all signals coupled through the first RF channels. The coupling signals are denoted as $a_i$, $\phi_i$, i=1, 2, ..., N, where i represents an $i^{th}$ first RF channel, N represents a quantity of first RF channels, $a_i$ represents an amplitude value of the $i^{th}$ first RF channel, and $\phi_i$ represents a phase value of the $i^{th}$ first RF channel. Through comparison with standard metering data, an amplitude deviation value and a phase deviation value that correspond to each first RF channel can be calculated.

For example, the amplitude deviation value of the $i^{th}$ first RF channel may be calculated by using the following formula:

$$\Delta a_i = a_i - a_i^{ref},\ i=1,2,\ldots,N$$

The phase deviation value of the $i^{th}$ first RF channel may be calculated by using the following formula:

$$\Delta\phi_i = \phi_i - \phi_i^{ref},\ i=1,2,\ldots,N$$

$\Delta a_i$ represents the amplitude deviation value of the $i^{th}$ first RF channel, and $\Delta\phi$ represents the phase deviation value of the $i^{th}$ first RF channel.

It may be understood that, if an amplitude value $a_k$ of a coupling signal from a $k^{th}$ first RF channel is far greater than or less than its corresponding unit measurement data $a_k^{ref}$, that is, $a_k \gg a_k^{ref}$ or $a_k \ll a_k^{ref}$, it is determined that the $k^{th}$ first RF channel in the first phased array has an exception or a channel fault, and channel amplitude-phase correction is not performed subsequently. Similarly, if a phase value $\phi_k$ of a coupling signal from a $k^{th}$ first RF channel is far greater than or less than its corresponding unit measurement data $\phi_k^{ref}$, that is, $\phi_k \gg \phi_k^{ref}$ or $\phi_k \ll \phi_k^{ref}$, it is determined that the $k^{th}$ first RF channel in the first phased array has an exception or a channel fault, and channel amplitude-phase correction is not performed subsequently. k is any integer ranging from 1 to N.

Operation 103: If the amplitude deviation value and the phase deviation value satisfy a preset error correction condition, the correction and testing apparatus corrects an amplitude coefficient and a phase coefficient that correspond to the first RF channel to obtain a target amplitude coefficient and a target phase coefficient.

In this embodiment, after the amplitude deviation value and the phase deviation value are obtained, whether an absolute value of the amplitude deviation value falls within a preset amplitude error range, and whether an absolute value of the phase deviation value falls within a preset phase error range need to be determined. If the two conditions are both satisfied, it is determined that the amplitude deviation value and the phase deviation value satisfy the preset error correction condition. That is, the amplitude coefficient and the phase coefficient that correspond to the first RF channel need to be corrected until the corrected amplitude deviation value and the corrected phase deviation value satisfy the preset error correction condition, and the corrected target amplitude coefficient and the corrected target phase coefficient are obtained. Otherwise, if the absolute value of the amplitude deviation value does not fall within the preset amplitude error range or the absolute value of the phase deviation value does not fall within the preset phase error range, it indicates that the amplitude coefficient and the phase coefficient do not need to be corrected.

In one embodiment, amplitude and phase thresholds, that is, an amplitude threshold $a_{th}$ and a phase threshold $\phi_{th}$ may be preset, and then an amplitude deviation value $\Delta a_i$ and a phase deviation value $\Delta \phi_i$ of each first RF channel are determined respectively based on $a_{th}$ and $\phi_{th}$. When the preset error correction condition is satisfied, that is, $$\max_{i=\{1,2,...N\}} |\Delta a_i| \geq a_{th} \text{ and } \max_{i=\{1,2,...N\}} |\Delta \phi_i| \geq \phi_{th},$$

the amplitude coefficient and the phase coefficient that correspond to the first RF channel need to be corrected until a maximum amplitude deviation value of each first RF channel on a reference plane of the second phased array is less than the preset amplitude threshold $a_{th}$, and a maximum phase deviation value is less than the preset phase threshold $\phi_{th}$.

When the preset error correction condition is not satisfied, that is, $$\max_{i=\{1,2,...N\}} |\Delta a_i| < a_{th} \text{ and/or } \max_{i=\{1,2,...N\}} |\Delta \phi_i| < \phi_{th},$$

the amplitude coefficient and the phase coefficient that correspond to the first RF channel do not need to be corrected.

It may be understood that, the amplitude threshold $a_{th}$ and the phase threshold $\phi_{th}$ may be set based on an actual situation. For a common phased array, the amplitude threshold $a_{th}$ may be set to −10 decibels (dB) or below, and the phase threshold $\phi_{th}$ may be set to 10° or below. For a high-precision phased array, the amplitude threshold $a_{th}$ may be set to −20 dB or below, and the phase threshold $\phi_{th}$ may be set to 1° or below. However, in actual application, the amplitude threshold $a_{th}$ and the phase threshold $\phi_{th}$ may be alternatively set according to a requirement. Only an example is provided herein, and should not be understood as a limitation on this application.

Operation 104: The correction and testing apparatus measures performance indicator parameters of the first phased array by using the target amplitude coefficient and the target phase coefficient.

In one embodiment, after the correction and testing apparatus corrects amplitude coefficients and phase coefficients that correspond to all first RF channels, target amplitude coefficients and target phase coefficients that correspond to the first RF channels can be obtained.

Specifically, after all the first RF channels of the first phased array are corrected, a backend processing device of the second phased array can be used to perform online monitoring on the performance indicator parameters of the first phased array. The performance indicator parameters include, but are not limited to, an equivalent isotropically radiated power (ERIP), an error vector amplitude (EVM), and a bit error rate (BER).

The correction and testing apparatus may further determine a beam directivity pattern of the first phased array based on the target amplitude coefficient and the target phase coefficient. The beam directivity pattern of the first phased array may be calculated, that is, a directivity pattern of a synthesized beam of the first phased array may be predicted according to the following formula:

$$F_{array}(\theta, \varphi) = A_{element}(\theta, \varphi) \sum_{i=1}^{N} a_i e^{j\phi_i} e^{-jk \cdot r_i}$$

$F_{array}(\theta,\varphi)$ represents the directivity pattern of a synthesized beam of the first phased array, $A_{element}(\theta,\varphi)$ represents an element directivity pattern in the first phased array, $a_i$ represents a target amplitude coefficient of a coupling signal corresponding to an $i^{th}$ first RF channel that has been corrected in the first phased array, $\phi$ represents a target phase coefficient of a coupling signal corresponding to the $i^{th}$ first RF channel that has been corrected in the first phased array, k represents a free space wave vector, $r_i$ and represents a position vector of the $i^{th}$ first RF channel in the first phased array.

In one embodiment of this application, the phased array correction and testing method is provided. The method is mainly applied to the correction and testing apparatus. The correction and testing apparatus includes the first phased array and the second phased array. The first phased array includes the first radio frequency RF channel, the second phased array includes the second RF channel, the first RF channel has a correspondence with the second RF channel, and the radiation front of the second phased array and the radiation front of the first phased array are spaced by the subwavelength distance. First, the correction and testing apparatus receives, through the second RF channel, the coupling signal sent through the first RF channel; and then, determines, based on the coupling signal, the amplitude deviation value and the phase deviation value that correspond to the first RF channel. If the amplitude deviation value and the phase deviation value satisfy the preset error correction condition, the correction and testing apparatus needs to correct the amplitude coefficient and the phase coefficient that correspond to the first RF channel to obtain the target amplitude coefficient and the target phase coefficient. Finally, the correction and testing apparatus may measure the performance indicator parameters of the first phased array by using the target amplitude coefficient and the target phase coefficient. In the foregoing manner, a calibrated mirror phased array and a to-be-tested phased array are disposed face to face by a subwavelength distance, and fast amplitude-phase correction is performed on all RF channels of the to-be-tested phased array by using a face-to-face direct coupling mechanism between antenna array elements, thereby improving test efficiency, reducing a floor area, and lowering costs. This greatly reduces time required for phased array correction and improves test efficiency of a phased array product.

In one embodiment, based on the foregoing embodiment corresponding to FIG. 2, in a first optional embodiment of the phased array correction and testing method provided in the embodiments of this application, after the amplitude deviation value and the phase deviation value that correspond to the first RF channel are determined based on the coupling signal, the method may further include:

obtaining a first position vector of the first RF channel in a space and a second position vector of the second RF channel in the space;

determining the amplitude coefficient and the phase coefficient based on the first position vector and the second position vector; and calculating a coupling coefficient based on a near-field electric field generated by the first RF channel, a near-field electric field generated by the second RF channel, the amplitude coefficient, and the phase coefficient.

In one embodiment, how to calculate the coupling coefficient is described. First, the correction and testing apparatus obtains the first position vector of the first RF channel in the space and the second position vector of the second RF channel in the space; and then calculates the amplitude coefficient and the phase coefficient based on the first position vector and the second position vector, where the amplitude coefficient and the phase coefficient are to-be-corrected parameters. Finally, the correction and testing apparatus calculates the coupling coefficient based on the near-field electric field generated by the first RF channel, the near-field electric field generated by the second RF channel, the amplitude coefficient, and the phase coefficient.

Specifically, if the coupling signals of all the first RF channels of the first phased array do not abnormally deviate from the standard metering data, an amplitude coefficient and a phase coefficient of each first RF channel in the first phased array may be corrected. It may be understood that before correction, it is necessary to determine that an amplitude deviation value corresponding to the amplitude coefficient and a phase deviation value corresponding to the phase coefficient satisfy the preset error correction condition.

Based on the amplitude deviation values and the phase deviation values (that is, $\Delta a_i$, $\Delta \phi_i$, i=1, 2, ..., N) of the first RF channels, the first RF channels of the first phased array are corrected by using a formula for calculating channel direct coupling compensation, Monte Carlo probability statistical estimation, and an iterative least square algorithm. At a subwavelength spacing, the coupling coefficient may be calculated by using the following formula:

$$C_{ii} = \frac{\iiint E_i^{DUT}(r, r_i^{DUT}) \cdot [E_i^{Imag}(r, r_i^{Imag})]^* dr}{\iiint [E_i^{DUT}(r, r_i^{DUT})] \cdot [E_i^{DUT}(r, r_i^{DUT})]^* dr \iiint [E_i^{Imag}(r, r_i^{Imag})] \cdot [E_i^{Imag}(r, r_i^{Imag})]^* dr}$$

$$= \kappa_{ii}(r_i^{DUT}; r_i^{Imag}) e^{j\Delta\phi_{ii}(r_i^{DUT}; r_i^{Imag})}$$

$C_{ii}$ represents a coupling coefficient, $E_i^{DUT}(r, r_i^{DUT})$ represents a near-field electric field generated by an $i^{th}$ first RF channel in the first phased array, $E_i^{Im\ ag}(r, r_i^{Im\ ag})$ represents a near-field electric field generated by an $i^{th}$ second RF channel in the second phased array, $r_i^{DUT}$ represents a first position vector of the first RF channel in the first phased array in a space, $r_i^{Imag}$ represents a second position vector of the $i^{th}$ second RF channel in the second phased array in the space, $\kappa_{ii}(r_i^{DUT}; r_i^{Im\ ag})$ represents an amplitude coefficient between the $i^{th}$ first RF channel and the $i^{th}$ second RF channel, and $\Delta\phi_{ii}(r_i^{DUT}; r_i^{Im\ ag})$ represents a phase coefficient between the $i^{th}$ first RF channel and the $i^{th}$ second RF channel.

Figure 4:
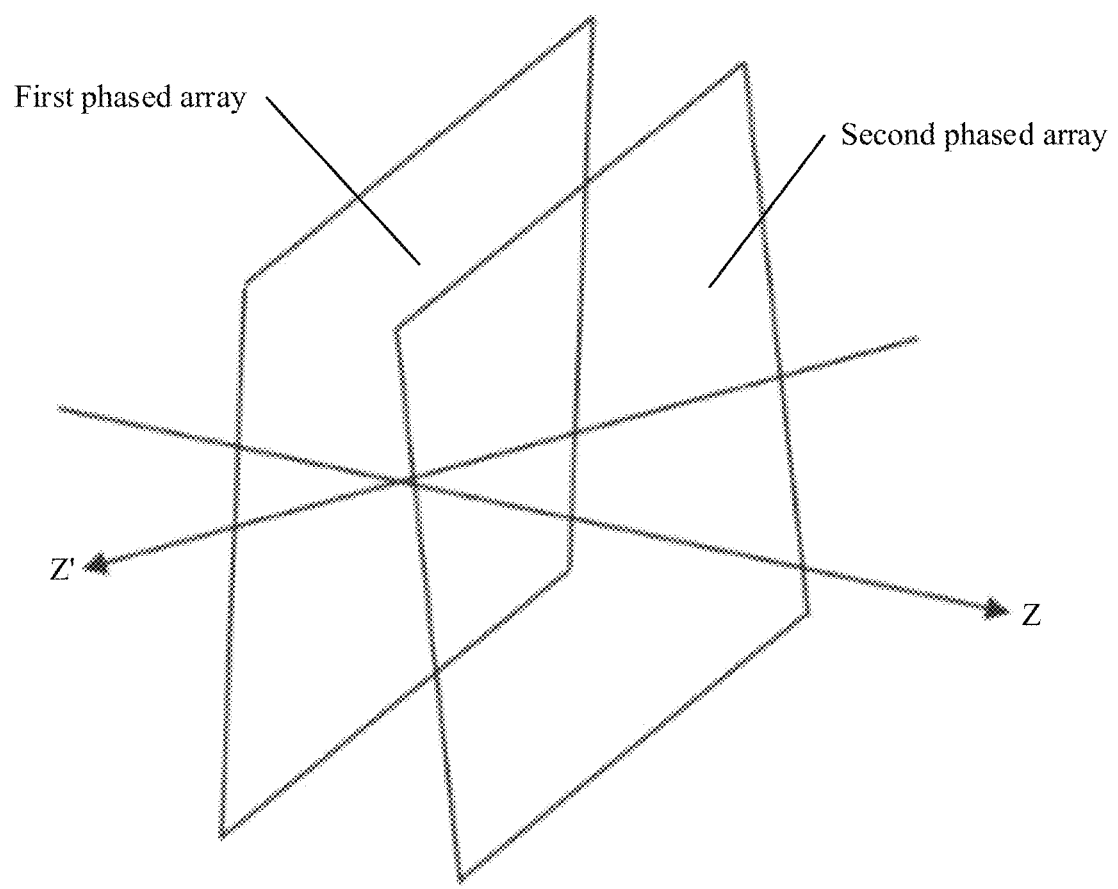
FIG. 4 is a schematic diagram of fronts of a first phased array and a second phased array according to an embodiment of this application.

In one embodiment, the front of the first phased array may not be totally parallel to the front of the second phased array. FIG. 4 is a schematic diagram of the fronts of the first phased array and the second phased array according to an embodiment of this application. There may be an included angle between the front of the first phased array and the front of the second phased array. The following describes how to calculate the target amplitude coefficient and the target phase coefficient in cases of different included angles and in cases in which the fronts are parallel or not parallel.

Case 1: The front of the first phased array is parallel to the front of the second phased array.

Figure 5:
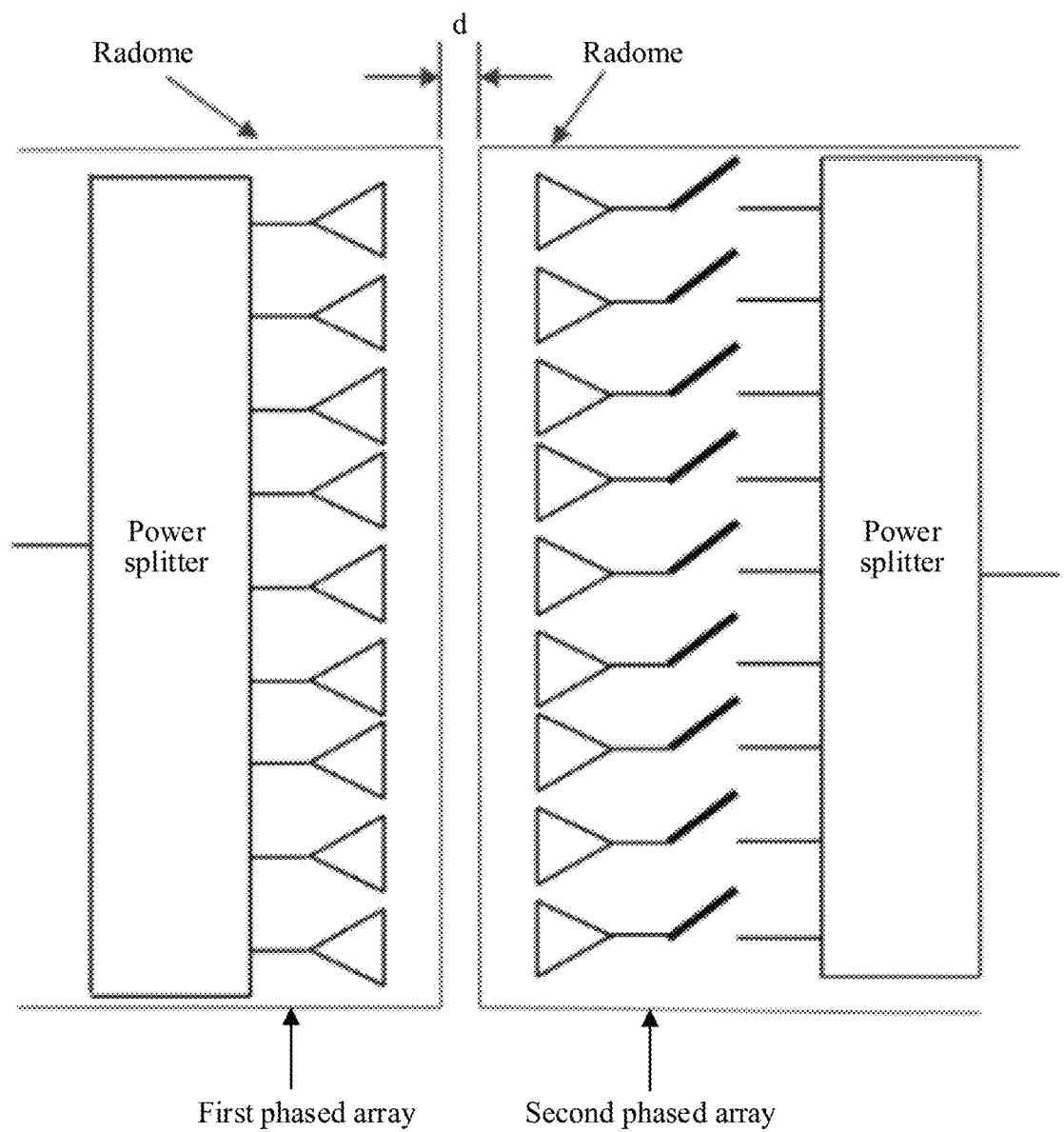
FIG. 5 is a schematic diagram of an embodiment in which a front of a first phased array is parallel to a front of a second phased array according to an embodiment of this application.

FIG. 5 is a schematic diagram of an embodiment in which the front of the first phased array is parallel to the front of the second phased array according to an embodiment of this application. As shown in the figure, in an ideal case, when $r_i^{DUT}$ and $r_i^{Imag}$ are on an ideal straight line, the front of the first phased array is totally parallel to the front of the second phased array, no axial deviation exists, centers of elements are aligned with each other, and all directly coupled RF channels have an equal spacing therebetween. Under a condition that the fronts are strictly parallel, a backhaul three-layered artificial neural network model is used. That is, a relationship model of an x direction and a coupling coefficient $C_{ii}$, a relationship model of a y direction and the coupling coefficient $C_{ii}$, and a relationship model of an xy-direction parallel deviation position ($\Delta x$, $\Delta y$) and the coupling coefficient $C_{ii}$ are established, and the three relationship models may be generally referred to as a preset relationship model.

Then, based on measured data, an amplitude coefficient $\kappa_{ii}(r_i^{DUT}; r_i^{Im\ ag})$ and a phase coefficient $\Delta\phi_{ii}(r_i^{DUT}; r_i^{Im\ ag})$ are corrected by using an artificial intelligence learning algorithm and a Monte Carlo probability prediction method, to improve correction precision of an element channel and obtain the corrected target amplitude coefficient and the corrected target phase coefficient.

Case 2: The front of the first phased array is not parallel to the front of the second phased array.

Figure 6:
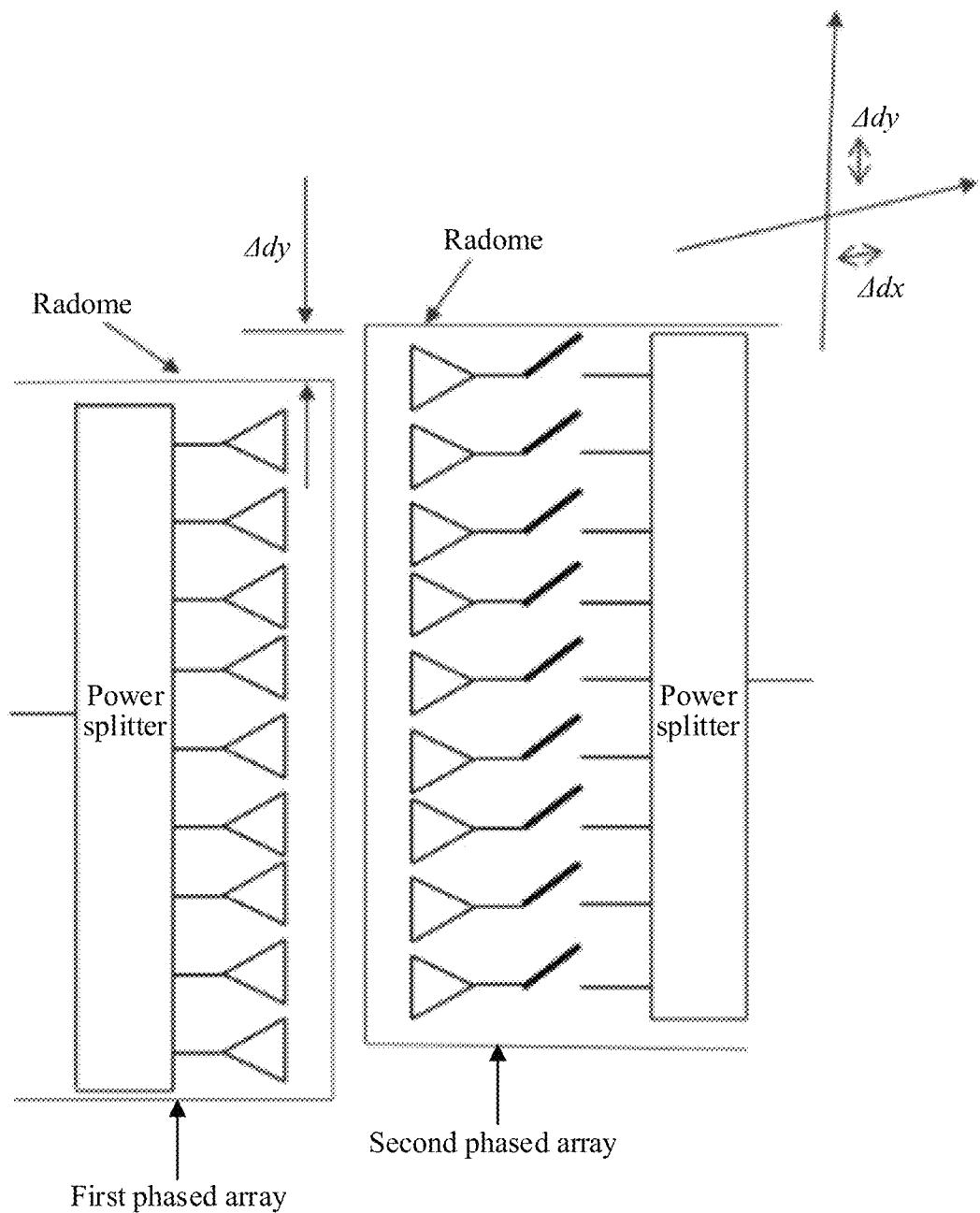
FIG. 6 is a schematic diagram of an embodiment in which a front of a first phased array is not parallel to a front of a second phased array according to an embodiment of this application.

FIG. 6 is a schematic diagram of an embodiment in which the front of first phased array is not parallel to the front of the second phased array according to an embodiment of this application. Because of factors such as an actual machining error, an assembly error of each array element antenna, a positioning error of spatial matching, and a device deformation error caused by a structural stress, the first RF channels of the first phased array are not neatly arranged, and the front of the first phased array is not strictly parallel to the front of the second phased array. First, a main axis of the first phased array is not parallel to that of the second phased array in a space, to form a specific included angle.

It may be understood that, a small included angle may be 10 degrees, 15 degrees, or 20 degrees, and a large included angle may be 45 degrees, 50 degrees, or 60 degrees. In actual application, the small included angle and the large included angle may be defined based on a case. This is not limited herein.

When the front of the first phased array is not parallel to the front of the second phased array, that is, when the main axis of the first phased array deviates from a main axis of the second phased array, the included angle between the front of the first phased array and the front of the second phased array needs to be obtained. Coordinate rotation transformation and a near-field coupling matrix analysis method are used to correct a coupling coefficient (which includes direct coupling and mutual coupling between RF channels) of a small-angle deviation and a coupling coefficient (which includes direct coupling and mutual coupling between RF channels) of a large-angle deviation.

If the included angle is a small included angle, the target amplitude coefficient is calculated based on a first amplitude correction coefficient and the amplitude coefficient, and the target phase coefficient is calculated based on a first phase correction coefficient and the phase coefficient, where the first amplitude correction coefficient represents preset amplitude correction coefficients in different directions, and the first phase correction coefficient represents preset phase correction coefficients in different directions. In a case of a small-angle main axis deviation, the corrected amplitude coefficient and the corrected phase coefficient are respectively:

$$\kappa_{ii}'(r_i^{DUT}; r_i^{Imag}) = (1+\Delta\eta_x)(1+\Delta\eta_y)(1+\Delta\eta_z)\kappa_{ii}(r_i^{DUT}; r_i^{Imag})$$

$$\Delta\phi_{ii}'(r_i^{DUT}; r_i^{Im\ ag}) = \Delta\phi_{ii}(r_i^{DUT}; r_i^{Im\ ag}) + \Delta\phi_{ii}^x + \Delta\phi_{ii}^y + \Delta\phi_{ii}^z$$

$\kappa_{ii}'(r_i^{DUT}; r_i^{Im\ ag})$ represents a target amplitude coefficient, $\Delta\eta_x$ represents a first amplitude correction coefficient in an x-axis direction, $\Delta\eta_y$ represents a first amplitude correction coefficient in a y-axis direction, $\Delta\eta_z$ represents a first amplitude correction coefficient in a main axis in a z-axis direction, $\kappa_{ii}(r_i^{DUT}; r_i^{Im\ ag})$ represents an amplitude coefficient, and the first amplitude correction coefficient is a preset parameter.

$\Delta\phi_{ii}'(r_i^{DUT}; r_i^{Im\ ag})$ represents a target phase coefficient, $\Delta\phi_{ii}^x$ represents a first phase correction coefficient in an x-axis direction, $\Delta\phi_{ii}^y$ represents a first phase correction coefficient in a y-axis direction, $\Delta\phi_{ii}^z$ represents a first phase correction coefficient in a main axis in a z-axis direction, and $\Delta\phi_{ii}(r_i^{DUT}; r_i^{Im\ ag})$ represents a phase coefficient.

If the included angle is a large included angle, the target amplitude coefficient is calculated based on the first amplitude correction coefficient, a second amplitude correction coefficient, and the amplitude coefficient, and the target phase coefficient is calculated based on the first phase correction coefficient, a second phase correction coefficient, and the phase coefficient, where the second amplitude correction coefficient represents an amplitude correction coefficient of coupling between RF channels, and the second phase correction coefficient represents a phase correction coefficient of coupling between the RF channels. In a case of a large-angle main axis deviation, the corrected amplitude coefficient and the corrected phase coefficient are respectively:

$$\kappa_{ii}''(r_i^{DUT}; r_i^{Imag}) = (1+\Delta\eta_x)(1+\Delta\eta_y)(1+\Delta\eta_z)\kappa_{ii}(r_i^{DUT}; r_i^{Imag}) + \sum_{l=1}^{L}\gamma_{il}\kappa_{il}(r_l^{DUT}; r_l^{Imag})$$

$$\Delta\phi_{ii}''(r_i^{DUT}; r_i^{Imag}) = \Delta\phi_{ii}(r_i^{DUT}; r_i^{Imag}) + \Delta\phi_{ii}^x + \Delta\phi_{ii}^y + \Delta\phi_{ii}^z + \sum_{l=1}^{L}\Delta\phi_{il}$$

$\kappa_{ii}''(r_i^{DUT}; r_i^{Im\ ag})$ represents a target phase coefficient, $\Delta\eta_x$ represents a first amplitude correction coefficient in an x-axis direction, $\Delta\eta_y$ represents a first amplitude correction coefficient in a y-axis direction, $\Delta\eta_z$ represents a first amplitude correction coefficient in a main axis in a z-axis direction, $\gamma_{il}$ represents a second amplitude correction coefficient caused by proximity coupling between an $i^{th}$ first RF channel and an $i^{th}$ second RF channel, and $\kappa_{ii}(r_i^{DUT}; r_i^{Im\ ag})$ represents an amplitude coefficient.

$\Delta\phi_{ii}''(r_i^{DUT}; r_i^{Im\ ag})$ represents a target amplitude coefficient, $\Delta\phi_{ii}^x$ represents a first phase correction coefficient in an x-axis direction, $\Delta\phi_{ii}^y$ represents a first phase correction coefficient in a y-axis direction, $\Delta\phi_{ii}^z$ represents a first phase correction coefficient in a main axis in a z-axis direction, $\Delta\phi_{il}$ represents a second phase correction coefficient caused by proximity coupling between an $i^{th}$ first RF channel and an $i^{th}$ second RF channel, and $\Delta\phi_{ii}(r_i^{DUT}; r_i^{Im\ ag})$ represents a phase coefficient.

Finally, measured deviation errors of the front in the x-axis, the y-axis, and the z-axis are substituted into the foregoing coupling coefficient calculation formulas, to calculate the amplitude coefficient and the phase coefficient of the coupling coefficient, and with reference to amplitude deviation values and phase deviation values ($\Delta a_i$, $\Delta\phi_i$, i=1, 2, . . . , N) of the first RF channels, actual amplitude and phase error data of each first RF channel is calculated and fed back to the first phased array. Parameter correction setting of the first RF channels is performed by using adjustable attenuators and phase shifters of the first phased array.

In addition, in one embodiment of this application, a standard second phased array controlled by a plurality of channel switches is constructed, a face-to-face direct coupling technology is used, information of the first RF channels of the first phased array are collected successively, and amplitude-phase correction of the first RF channels of the first phased array, channel fault or failure detection, and performance indicator parameter measurement and calculation are implemented at a subwavelength spacing. In the foregoing manner, the phased array antenna can be corrected and tested effectively, and the foregoing manner achieves good stability, facilitates maintenance, and is suitable for testing of products in batches on an assembly line, thereby improving applicability and operability of the solution.

In one embodiment, based on the embodiment corresponding to FIG. 2, in a second optional embodiment of the phased array correction and testing method provided in the embodiments of this application, before the coupling signal sent through the first RF channel is received through the second RF channel, the method may further include:

when a transmission amplitude value of the second RF channel is largest, determining corresponding positions of the first phased array and the second phased array.

In one embodiment, before the correction and testing apparatus receives, through the second RF channel, the coupling signal sent through the first RF channel, the first phased array needs to be aligned with the second phased array.

Specifically, first, the correction and testing apparatus performs a peak search in x-axis and y-axis dimensions, where the x-axis and the y-axis are respectively a horizontal axis and a vertical axis. Transmission amplitude values corresponding to the second phased array at different coordinate positions are obtained through the peak search, where the coordinate positions are positions on the x-axis and the y-axis. In a feasible manner, when a root mean square (RMS) of transmission amplitude values of all second RF channels is a maximum value, it may be considered that the front of the first phased array is aligned with the front of the second phased array, and subsequent correction and testing on the phased array can be continued.

In addition, in one embodiment of this application, after the coupling signal sent through the first RF channel is received through the second RF channel, positions of the first phased array and the second phased array further need to be adjusted, and when the positions are adjusted to optimal positions, the transmission amplitude value of the second RF channel should be largest. In the foregoing manner, optimal position points of the first phased array and the second phased array can be found by using a physical position search method, and correction and testing is performed based on the optimal position points, thereby achieving a more accurate and efficient correction and testing effect.

Figure 7:
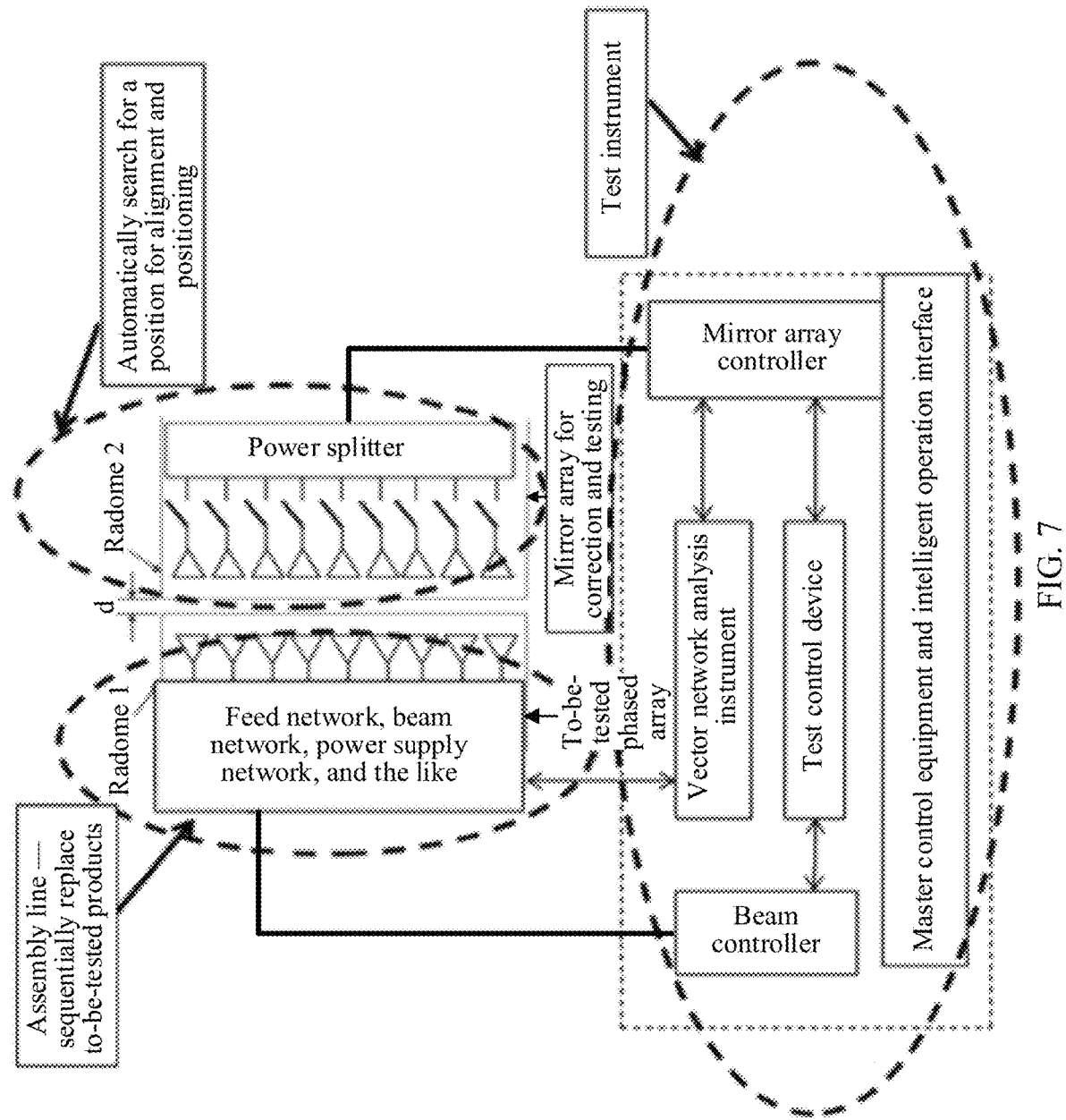
FIG. 7 is a schematic functional diagram of a correction and testing apparatus in an application scenario according to this application.

For ease of understanding, the phased array correction and testing method in this embodiment of this application is described in detail by using a specific application scenario. FIG. 7 is a schematic functional diagram of a correction and testing apparatus in an application scenario according to this application. As shown in the figure, a positioning hole of a to-be-tested phased array (the first phased array) is aligned with a positioning mark of a mirror array for correction and testing (the second phased array) through a mechanical arm, for spatial assembly of the to-be-tested phased array. To ensure efficiency of direct coupling between RF channels, a spacing between a radome of the to-be-tested phased array and a radome of the mirror array for correction and testing is $d_0$, $d_0$ is fixed by a dowel pin device at a subwavelength level, that is, shorter than $\frac{1}{5}$ central operating wavelength.

Therefore, in this case, a spacing between the to-be-tested phased array and the mirror array for correction and testing is d, a distance between the to-be-tested phased array and the radome of the to-be-tested phased array is $d_1$, the spacing between the radome of the to-be-tested phased array and the radome of the mirror array for correction and testing is do, and a distance between the mirror array for correction and testing and array radome of the mirror correction and testing is $d_2$. Then, $d=d_1+d_0+d_2$.

Using a 9-element to-be-tested phased array as an example, a same 9-element antenna mirror array for correction and testing is used, and is placed at a position distant from the to-be-tested phased array by $d_0=\frac{1}{20}$ wavelength. A thickness of a radome 1 is $d_1=\frac{1}{15}$ wavelength. The radome 1 covers the to-be-tested phased array. A thickness of a radome 2 is $d_2=\frac{1}{15}$ wavelength, and the radome 2 covers the mirror array for correction and testing. The 9-element antenna of the mirror array for correction and testing is connected to nine same single pole single throw switches respectively, and then connected to a power splitter.

The standard second phased array controlled by the plurality of channel switches uses the face-to-face direct coupling technology to implement amplitude-phase correction of the channels of the first phased array, channel fault or failure detection, and performance indicator parameter measurement and calculation at the subwavelength spacing.

The following uses a specific application scenario to describe how to perform deviation correction on the front of the first phased array and the front of the second phased array. Still referring to FIG. 7, first, a coupling coefficient that does not deviate is calculated and denoted as $r_1$. Then, the first phased array is kept unchanged in a y direction and deviates in an x direction by $x_1=2$ mm, $x_2=3$ mm, and $x_3=4$ mm, and coupling coefficient calculation is performed with respect to the deviations to obtain $rx_1$, $rx_2$, and $rx_3$. Similarly, the first phased array is kept unchanged in the x direction and deviates in the y direction by $y_1=2$ mm, $y_2=3$ mm, and $y_3=4$ mm, and coupling coefficient calculation is performed with respect to the deviations to obtain $ry_1$, $ry_2$, and $ry_3$. Finally, coupling coefficient calculation is performed with respect to the deviations of $x_1=2$ mm, $x_2=3$ mm, $x_3=4$ mm, $y_1=2$ mm, $y_2=3$ mm, and $y_3=4$ mm to obtain $r_{11}$, $r_{12}$, $r_{13}$, $r_{21}$, $r_{22}$, $r_{23}$, $ry_{31}$, $ry_{32}$, and $ry_{33}$. Based on measured data and an artificial intelligence learning algorithm, a relationship model between a position deviation x and a coupling coefficient r and a relationship model between a position deviation y and the coupling coefficient r are separately set up, to improve coupling coefficient calculation precision.

Finally, measured deviation errors of the front in the x-axis, the y-axis, and the z-axis are substituted into the foregoing coupling coefficient calculation formulas, to calculate the amplitude coefficient and the phase coefficient of the coupling coefficient, and with reference to amplitude deviation values and phase deviation values ($\Delta a_i$, $\Delta \phi_i$, i=1, 2, . . . , N) of the first RF channels, actual amplitude and phase error data of each first RF channel is calculated and fed back to the first phased array. Parameter correction setting of the first RF channels is performed by using adjustable attenuators and phase shifters of the first phased array.

Figure 8:
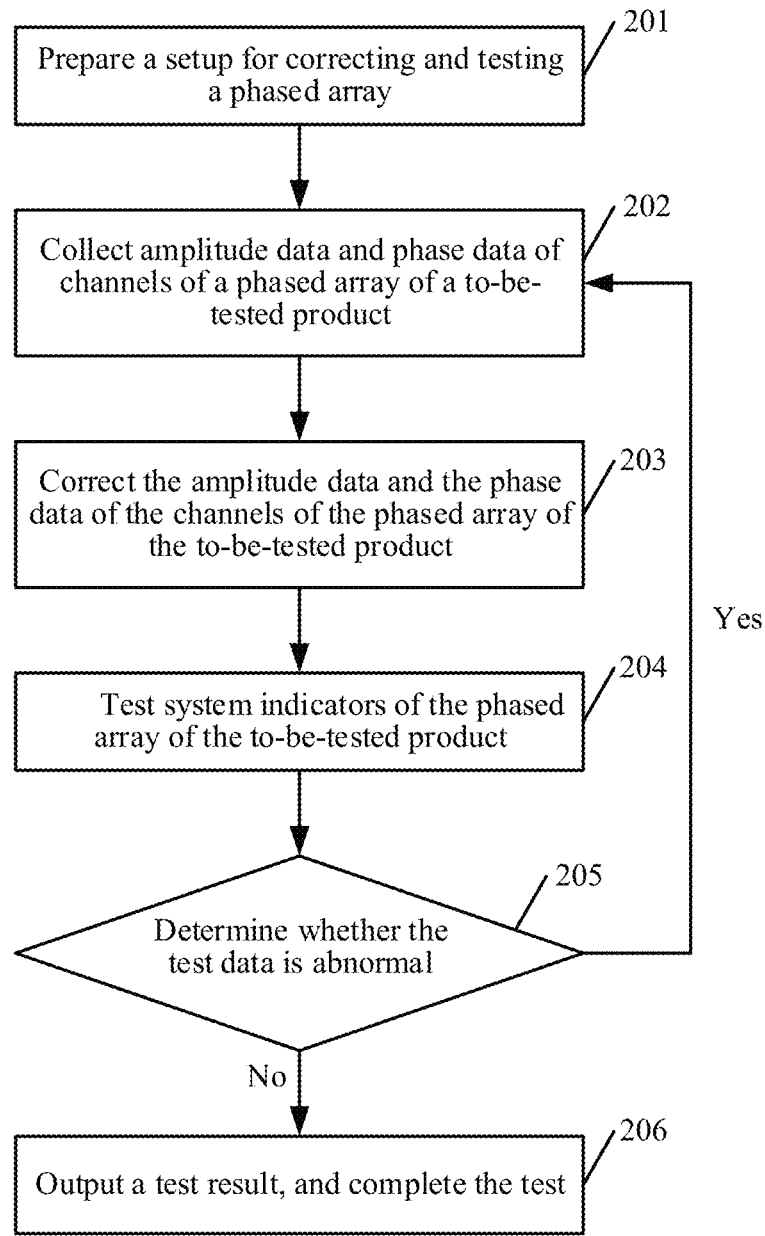
FIG. 8 is a schematic flowchart of a phased array correction and testing method in an application scenario according to this application.

With reference to the content shown in FIG. 7, FIG. 8 is a schematic flowchart of the phased array correction and testing method in an application scenario according to one embodiment of this application. As shown in the figure, in operation 201, a setup for correcting and testing a phased array needs to be prepared first, that is, a test environment is set up, including one mirror array for correction and testing (the second phased array) whose quantity of channel elements is greater than or equal to that of a to-be-tested phased array (the first phased array). The mirror array for correction and testing is calibrated by using a national standard-compliant metering device, and is mounted on an assembly line test platform.

In operation 202, amplitude data and phase data of RF channels of a to-be-tested phased array are collected. Specifically, during assembly line testing, a mechanical arm mounts the to-be-tested phased array by using a positioning hole, and then, the amplitude data and the phase data of the RF channels of the to-be-tested phased array are collected at a subwavelength spacing by using the face-to-face direct coupling technology.

In operation 203, the amplitude data and the phase data of the RF channels of the to-be-tested phased array are corrected.

In operation 204, after the to-be-tested phased array is corrected, performance indicator parameters of the to-be-tested phased array may be further measured, where the performance indicator parameters include a transmit performance indicator, a receive performance indicator, and the like.

In operation 205, the collected test data is determined and analyzed; and if the amplitude data and the phase data are abnormal (all or some of the amplitude data and the phase data exceeds thresholds), the process goes back to operation 202; or if the amplitude data and the phase data are both normal, operation 206 is performed.

In operation 206, a test result is output, and the test is complete. In this case, the tested phased array can be disassembled by using a mechanical arm, and then, correction and testing of a next to-be-tested phased array start, that is, operation 201 to operation 205 are repeated.

Figure 9:
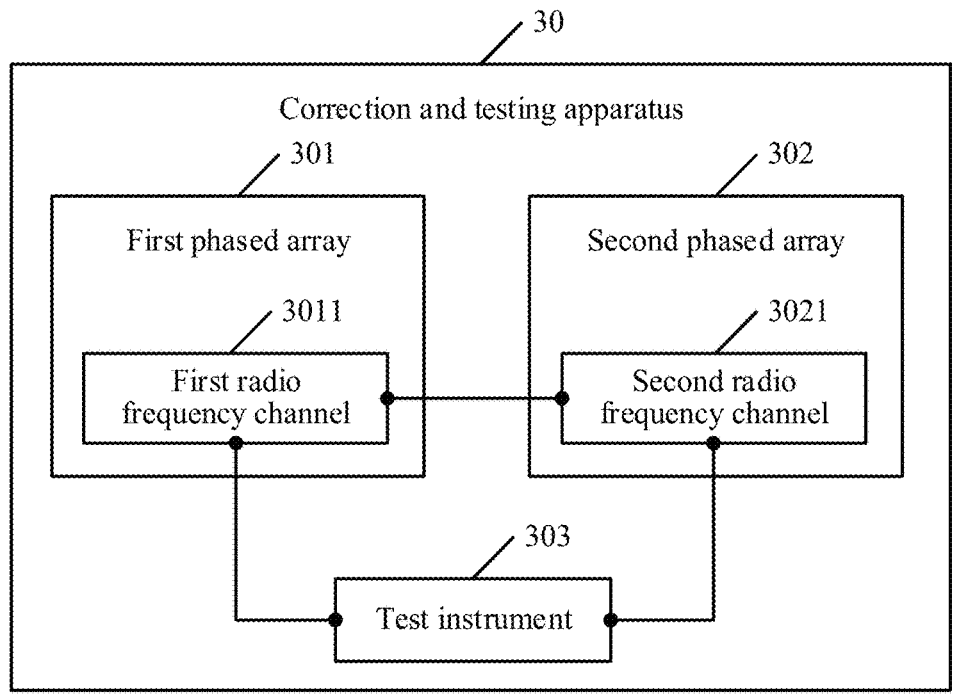
FIG. 9 is another schematic structural diagram of a correction and testing apparatus according to an embodiment of this application.

The correction and testing apparatus in this application is described in detail below. Referring to FIG. 9, a correction and testing apparatus 30 in an embodiment of this application includes a first phased array 301, a second phased array 302, and a test instrument 303, where the first phased array 301 is a to-be-tested phased array, the first phased array 301 includes a first RF channel 3011, the second phased array 302 includes a second RF channel 3021, a topology of the first RF channel 3011 has a mirror symmetry relationship with a topology of the second RF channel 3021, and a radiation front of the second phased array 302 and a radiation front of the first phased array 301 are spaced by a subwavelength distance. The correction and testing apparatus 30 includes:

The second phased array 302 is configured to receive, through the second RF channel 3021, a coupling signal sent by the first phased array 301 through the first RF channel 3011.

The test instrument 303 is configured to determine, based on the coupling signal, an amplitude deviation value and a phase deviation value that correspond to the first RF channel 3011.

If the amplitude deviation value and the phase deviation value satisfy a preset error correction condition, the test instrument 303 is configured to correct an amplitude coefficient and a phase coefficient that correspond to the first RF channel 3011 to obtain a target amplitude coefficient and a target phase coefficient.

The test instrument 303 is configured to measure performance indicator parameters of the first phased array 3011 by using the target amplitude coefficient and the target phase coefficient.

In one embodiment, first, a positioning hole of the first phased array 301 is aligned with a positioning mark of the second phased array 302 through a mechanical arm, for spatial assembly of the first phased array 301. It should be noted that an alignment manner may be laser alignment or dowel pin positioning, or may be another alignment manner. This is not limited herein.

To ensure efficiency of direct coupling between the $i^{th}$ first RF channel 3011 and the second RF channel, a spacing between a radome of the first phased array 301 and a radome of the second phased array 302 is $d_0$, where $d_0$ is less than a wavelength. If a spacing between the first phased array 301 and the second phased array 302 is d, a distance between the first phased array 301 and the radome of the first phased array 301 is $d_1$, the spacing between the radome of the second phased array 302 and the radome of the first phased array 301 is do, and a distance between the second phased array 302 and the radome of the second phased array 302 is $d_2$, $d=d_1+d_0+d_2$.

In addition, when a transmission amplitude value of the second RF channel 3021 is largest, the test instrument 303 may determine corresponding positions of the first phased array 301 and the second phased array 302.

The correction and testing apparatus 30 first determines, based on the coupling signal transmitted from the first phased array 301, an amplitude value and a phase value that correspond to each first RF channel 3011, and then calculates, based on standard metering data, an amplitude deviation value and a phase deviation value that correspond to the first RF channel 3011. After the amplitude deviation value and the phase deviation value are obtained, the correction and testing apparatus 30 needs to determine whether an absolute value of the amplitude deviation value falls within a preset amplitude error range, and whether an absolute value of the phase deviation value falls within a preset phase error range. If the two conditions are both satisfied, it is determined that the amplitude deviation value and the phase deviation value satisfy the preset error correction condition, that is, an amplitude coefficient and a phase coefficient that correspond to the first RF channel 3011 need to be corrected until the corrected amplitude deviation value and the corrected phase deviation value satisfy the preset error correction condition, and the corrected target amplitude coefficient and the corrected target phase coefficient are obtained. Otherwise, if the absolute value of the amplitude deviation value does not fall within the preset amplitude error range or the absolute value of the phase deviation value does not fall within the preset phase error range, it indicates that the amplitude coefficient and the phase coefficient do not need to be corrected.

Finally, after the correction and testing apparatus 30 corrects amplitude coefficients and phase coefficients that correspond to all first RF channels 3011, target amplitude coefficients and target phase coefficients that correspond to the first RF channels 3011 can be obtained. In addition, the correction and testing apparatus 30 may further determine a beam directivity pattern of the first phased array 301 based on the target amplitude coefficients and the target phase coefficients.

In one embodiment of this application, the correction and testing apparatus is provided. A calibrated mirror phased array and a to-be-tested phased array are disposed face to face by a subwavelength distance, and fast amplitude-phase correction is performed on all RF channels of the to-be-tested phased array by using a face-to-face direct coupling mechanism between antenna array elements, thereby improving test efficiency, reducing a floor area, and lowering costs. This can greatly reduce time required for phased array correction and improve test efficiency of a phased array product.

Figure 10:
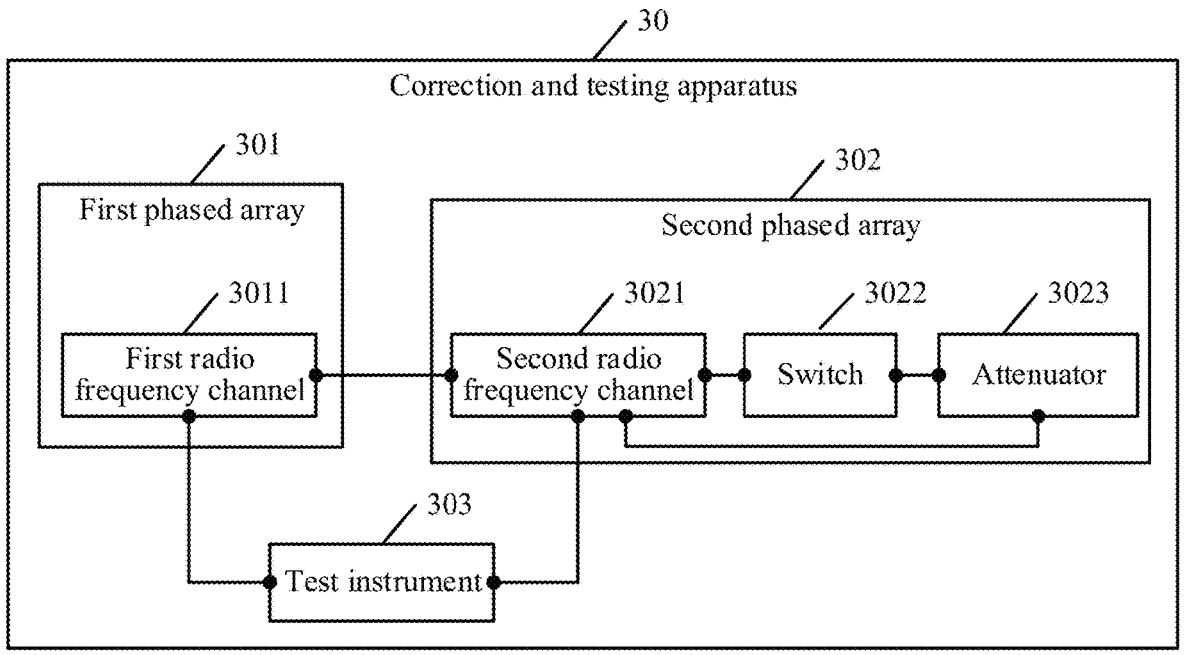
FIG. 10 is another schematic structural diagram of a correction and testing apparatus according to an embodiment of this application.

In one embodiment, based on the foregoing embodiment corresponding to FIG. 9, referring to FIG. 10, in another embodiment of the correction and testing apparatus 30 provided in the embodiments of this application, the first phased array 301 includes a plurality of first RF channels 3011, the second phased array 302 includes a plurality of second RF channels 3021, and the second phased array 302 further includes a plurality of switches 3022 and a plurality of attenuators 3023. Each switch 3022 is connected to each second RF channel 3021, and each attenuator 3023 is connected to each second RF channel 3021.

The switches 3022 are configured to switch off the plurality of second RF channels 3021.

When the plurality of second RF channels 3021 are in an off state, the switches 3022 are configured to switch on a target second RF channel in the plurality of second RF channels 3021, where the target second RF channel is any second RF channel 3021 in the plurality of second RF channels 3021.

The second RF channels 3021 are configured to receive, through the target second RF channel, a coupling signal sent through a target first RF channel, until coupling signals sent through the plurality of first RF channels 3011 are all received, where the target first RF channel is a first RF channel 3011 in the plurality of first RF channels 3011 that has a mirror symmetry relationship with the target second RF channel.

Each attenuator 3023 is configured to perform signal attenuation processing on the coupling signal.

In one embodiment, (1) the switches 3022 are configured to: when the plurality of second RF channels 3021 are in the off state, switch on an $n^{th}$ second RF channel 3021 in the plurality of second RF channels 3021, where n is a positive integer.

(2) The second RF channels 3021 are configured to receive, through the $n^{th}$ second RF channel 3021, a coupling signal sent through an $n^{th}$ first RF channel 3011, where the $n^{th}$ second RF channel 3021 has a mirror symmetry relationship with the $n^{th}$ first RF channel 3011.

(3) The switch 3022 is configured to switch off the $n^{th}$ second RF channel 3021.

The switches 3022 and the second RF channels 3021 are configured to separately perform operations of step (1) to step (3) on the plurality of second RF channels 3021 having a mirror symmetry relationship with the plurality of first RF channels 3011, until the coupling signals sent through the plurality of first RF channels 3011 are all received by the plurality of second RF channels.

In one embodiment, after precise correction is strictly performed on the second phased array 302, the second phased array 302 is mounted on a fixed assembly line test platform as a standard correction and testing device of the first phased array 301. A matrix of the switches 3022 performs on-off control on each second RF channel 3021 of the second phased array 302. First, all the second RF channels 3021 are switched off; then, the second RF channels 3021 are sequentially switched on; and further, the coupling signals sent through the first RF channels 3011 are received through the second RF channels 3021 to perform amplitude-phase correction of channels one by one or selectively. If all first RF channels 3011 need to be synchronously corrected, it only needs to set the second RF channels 3021 to a receiving state by using all the switches 3022.

It may be understood that each second RF channel 3021 is connected to a separate switch 3022 and a separate attenuator 3023 separately, and then is connected to a power splitter. Specifically, the switch 3022 may be a single pole single throw (SPST) switch, where the SPST is a type of coaxial switch. Optionally, the switch 3022 may alternatively be a single pole double throw (SPDT) switch, a double pole double throw (DPDT) switch, a single pole six throw (SP6T) switch, or the like. Only an example is provided herein, and should not be understood as a limitation on this solution.

In addition, the attenuator 3023 can protect a circuit, and can further adjust strength of a signal in the circuit, and in a comparative measurement circuit, can be used to directly read an attenuation value of a to-be-tested network and improve impedance matching. If some circuits require a relatively stable load impedance, an attenuator may be inserted between the circuit and an actual load impedance to mitigate an impedance change.

In addition, in one embodiment of this application, first, all the second RF channels corresponding to the first RF channels are switched off; then, these second RF channels are sequentially switched on; and finally, the coupling signal sent through each first RF channel is received through each second RF channel. In the foregoing manner, amplitude-phase correction and measurement can be performed on the to-be-tested phased array in a one-by-one manner, that is, correction and testing can be performed on each first RF channel. Compared with performing correction and testing on a plurality of RF channels simultaneously, this application helps to improve accuracy of correction and testing.

Figure 11:
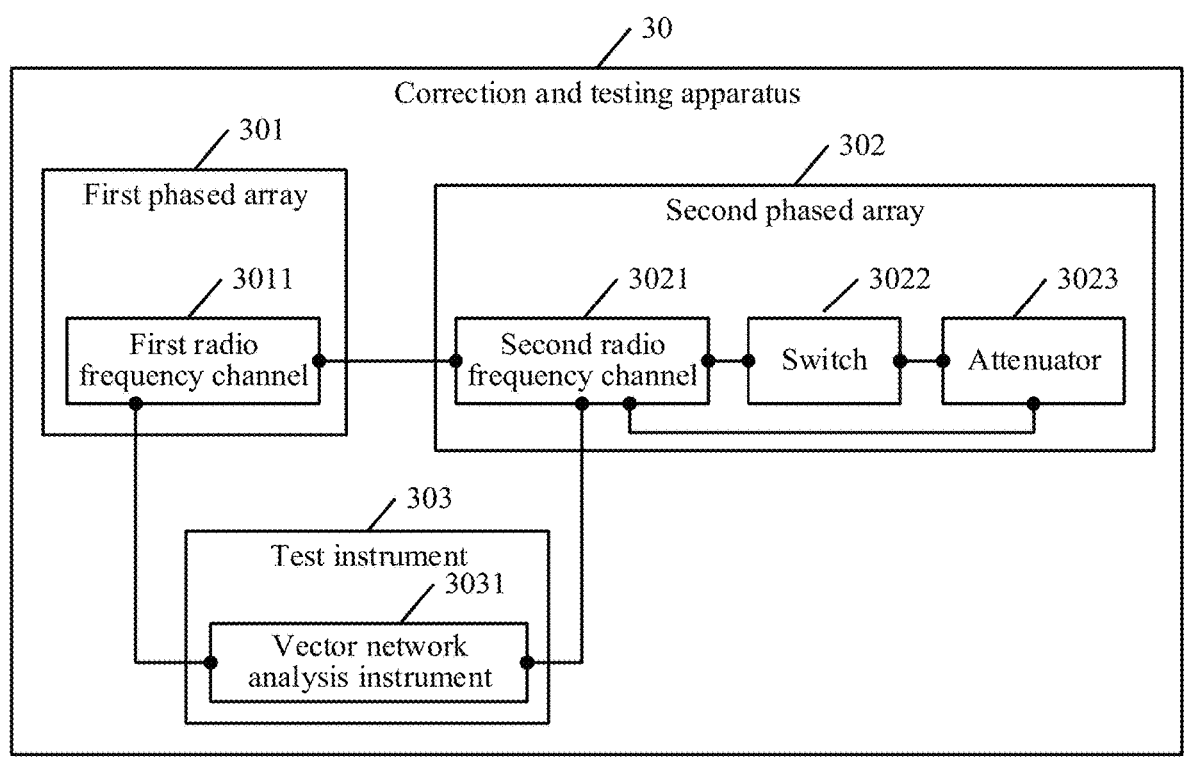
FIG. 11 is another schematic structural diagram of a correction and testing apparatus according to an embodiment of this application.

In one embodiment, based on the foregoing embodiment corresponding to FIG. 9, referring to FIG. 11, in another embodiment of the correction and testing apparatus 30 provided in the embodiments of this application, the test instrument 303 includes a vector network analysis instrument 3031.

The vector network analysis instrument 3031 is configured to obtain, based on a coupling signal, an amplitude value and a phase value that correspond to a first RF channel 3011.

The vector network analysis instrument 3031 is configured to calculate, based on the amplitude value and a preset amplitude value, the amplitude deviation value corresponding to the first RF channel 3011.

The vector network analysis instrument 3031 is configured to calculate, based on the phase value and a preset phase value, the phase deviation value corresponding to the first RF channel 3011.

In one embodiment, the vector network analysis instrument 3031 is a device for testing electromagnetic wave energy. The vector network analysis instrument 3031 not only can measure various parameter amplitude values of a one-port network or a two-port network, but also can measure a phase value.

For example, it is assumed that standard metering data corresponding to the first RF channel 3011 is denoted $a_i^{ref}$, $\phi_i^{ref}$, i=1, 2, ..., N, where i represents an first RF channel 3011, N represents a quantity of first RF channels 3011, $a_i^{ref}$ represents a preset amplitude value of the $i^{th}$ first RF channel 3011, and $\phi_i^{ref}$ represents a preset phase value of the $i^{th}$ first RF channel 3011. In a mode of correcting RF channels one by one, the matrix of switches 3022 performs on-off switching on the switches of the second RF channels 3021 in the second phased array 302 sequentially based on numbers of the second RF channels 3021, to perform amplitude-phase measurement and correction on the first RF channels 3011 of the first phased array 301 one by one.

In a mode of synchronously correcting all channels, the matrix of switches 3022 sets the switches of all the second RF channels 3021 in the second phased array 302 to a channel receiving state, and then, synchronously measures and records all signals coupled through the first RF channels 3011. The coupling signals are denoted as $a_i$, $\phi_i$, i=1, 2, ..., N, where i represents an $i^{th}$ first RF channel 3011, N represents a quantity of first RF channels 3011, $a_i$ represents an amplitude value of the $i^{th}$ first RF channel 3011, and $\phi_i$ represents a phase value of the $i^{th}$ first RF channel 3011. Through comparison with standard metering data, an amplitude deviation value and a phase deviation value that correspond to each first RF channel 3011 can be calculated.

For example, the amplitude deviation value of the $i^{th}$ first RF channel 3011 may be calculated by using the following formula:

$$\Delta a_i = a_i - a_i^{ref}, i=1,2,\ldots,N$$

The phase deviation value of the $i^{th}$ first RF channel 3011 may be calculated by using the following formula:

$$\Delta\phi_i = \phi_i - \phi_i^{ref}, \; i=1,2,\ldots,N$$

$\Delta a_i$ represents the amplitude deviation value of the $i^{th}$ first RF channel 3011, and $\Delta\phi$ represents the phase deviation value of the $i^{th}$ first RF channel 3011.

In addition, in one embodiment of this application, the amplitude value and the phase value that correspond to the first RF channel are obtained based on the coupling signal, and then the required amplitude deviation value and the required phase deviation value are calculated by using the preset amplitude value and the preset phase value respectively. In the foregoing manner, deviation values between the currently measured amplitude and phase values and the preset amplitude and phase values can be obtained, and the deviation values are used to determine whether the RF channel has an exception or a fault, thereby helping to improve applicability and operability of the solution. In addition, the test instrument can effectively correct a position deviation caused by machining, channel assembly, test of matching assembly, and structural deformation, helping to improve feasibility of the solution.

Figure 12:
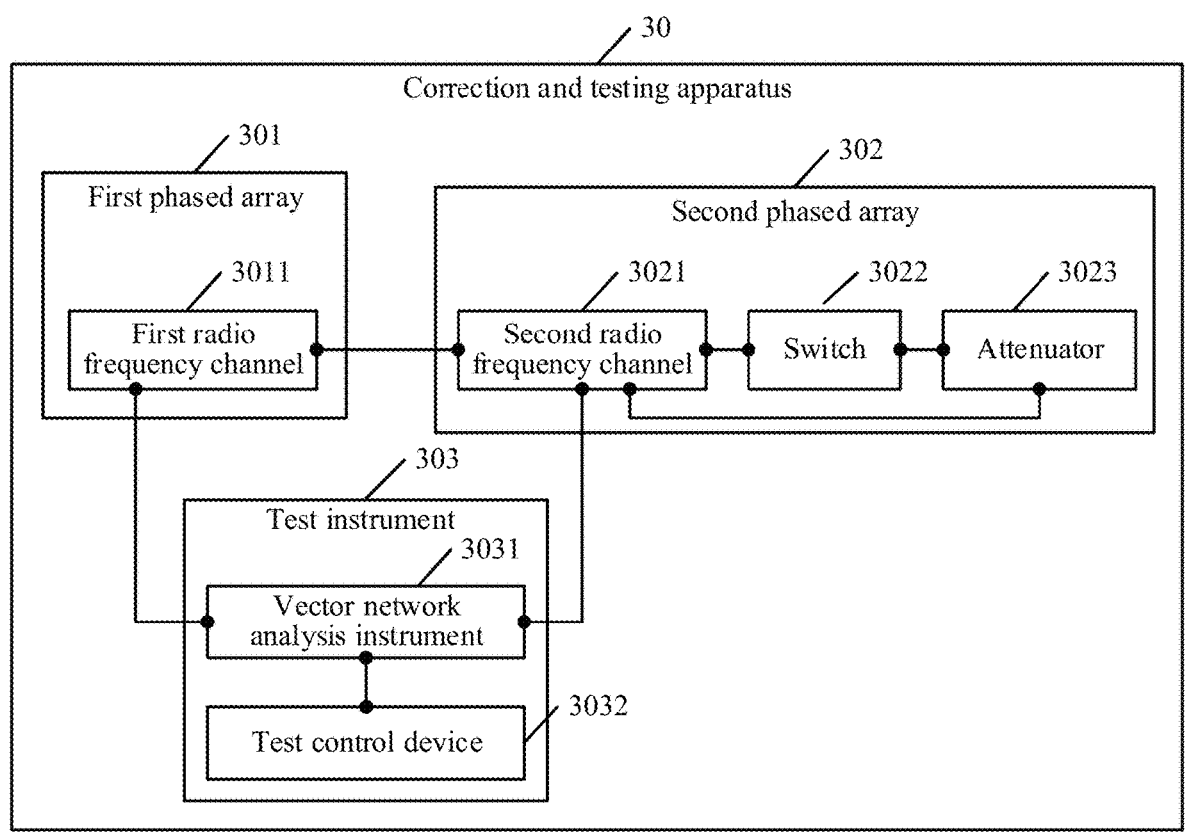
FIG. 12 is another schematic structural diagram of a correction and testing apparatus according to an embodiment of this application.

In one embodiment, based on the embodiment corresponding to any one of FIG. 9 to FIG. 11, referring to FIG. 12, in another embodiment of the correction and testing apparatus 30 provided in the embodiments of this application, the test instrument 303 includes a test control device 3032.

The test control device 3032 is configured to determine whether an absolute value of the amplitude deviation value falls within a preset amplitude error range, and whether an absolute value of the phase deviation value falls within a preset phase error range.

If the absolute value of the amplitude deviation value falls within the preset amplitude error range, and the absolute value of the phase deviation value falls within the preset phase error range, the test control device 3022 is configured to determine that the amplitude deviation value and the phase deviation value satisfy the preset error correction condition.

In one embodiment, the test control device 3032 needs to determine whether the absolute value of the amplitude deviation value falls within the preset amplitude error range, and whether the absolute value of the phase deviation value falls within the preset phase error range. If the two conditions are both satisfied, the test control device 3032 determines that the amplitude deviation value and the phase deviation value satisfy the preset error correction condition. That is, the amplitude coefficient and the phase coefficient that correspond to the first RF channel 3011 need to be corrected until the corrected amplitude deviation value and the corrected phase deviation value satisfy the preset error correction condition, and the corrected target amplitude coefficient and the corrected target phase coefficient are obtained. Otherwise, if the absolute value of the amplitude deviation value does not fall within the preset amplitude error range or the absolute value of the phase deviation value does not fall within the preset phase error range, it indicates that the amplitude coefficient and the phase coefficient do not need to be corrected.

In addition, the test instrument 303 may alternatively obtain a first position vector of the first RF channel 3011 in a space and a second position vector of the second RF channel 3021 in the space, and then, determine the amplitude coefficient and the phase coefficient based on the first position vector and the second position vector. The test instrument 303 calculates a coupling coefficient based on a near-field electric field generated by the first RF channel 3011, a near-field electric field generated by the second RF channel 3021, the amplitude coefficient, and the phase coefficient.

If a front of the first phased array 301 is parallel to a front of the second phased array 302, the test instrument 303 trains the amplitude coefficient and the phase coefficient by using a preset relationship model. The test instrument 303 is specifically configured to obtain the trained target amplitude coefficient and the trained target phase coefficient, where the preset relationship model is a functional relationship model between the coupling coefficient and a parallel deviation position.

If the front of the first phased array 301 is not parallel to the front of the second phased array 302, the test instrument 303 first obtains an included angle between the front of the first phased array 301 and the front of the second phased array 302. If the included angle is a small included angle, the test instrument 303 calculates the target amplitude coefficient based on a first amplitude correction coefficient and the amplitude coefficient, and calculates the target phase coefficient based on a first phase correction coefficient and the phase coefficient, where the first amplitude correction coefficient represents preset amplitude correction coefficients in different directions, and the first phase correction coefficient represents preset phase correction coefficients in different directions. If the included angle is a large included angle, the test instrument 303 is specifically configured to calculate the target amplitude coefficient based on the first amplitude correction coefficient, a second amplitude correction coefficient, and the amplitude coefficient, and calculate the target phase coefficient based on the first phase correction coefficient, a second phase correction coefficient, and the phase coefficient, where the second amplitude correction coefficient represents an amplitude correction coefficient of coupling between RF channels, and the second phase correction coefficient represents a phase correction coefficient of coupling between the RF channels.

In addition, the test instrument 303 may further determine a beam directivity pattern of the first phased array 301 based on the target amplitude coefficient and the target phase coefficient.

It may be understood that, functions of the vector network analysis instrument 3031 and functions of the test control device 3022 may be integrated on one device, for example, are all integrated on the vector network analysis instrument 3031 or are all integrated on the test control device 3022, and in an actual application, may be alternatively integrated on another module of the test instrument 303. This is not limited herein.

Further, in one embodiment of this application, when the first phased array and the second phased array are parallel to each other, the obtained amplitude coefficient and the obtained phase coefficient are trained by using the preset relationship model. When the first phased array and the second phased array are not parallel to each other, an included angle between the front of the first phased array and the front of the second phased array is obtained first, and a corresponding correction manner is selected based on a type of the included angle. In the foregoing manner, the amplitude coefficient and the phase coefficient are corrected based on measured data, to obtain the corresponding target amplitude coefficient and the corresponding target phase coefficient, to improve correction precision of each first RF channel.

Figure 13:
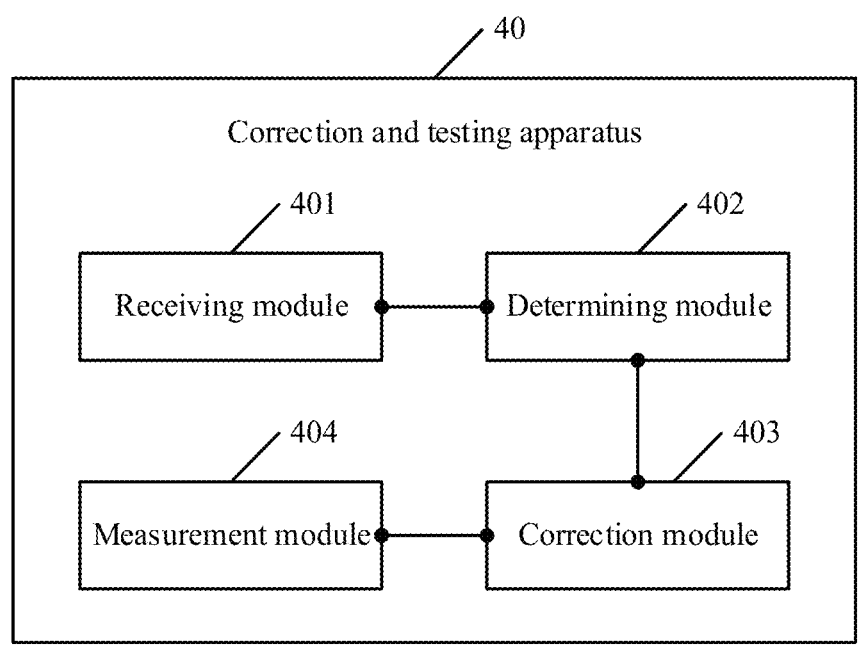
FIG. 13 is a schematic diagram of an embodiment of a correction and testing apparatus according to an embodiment of this application.

A correction and testing apparatus corresponding to an embodiment in this application is described in detail below. Referring to FIG. 13, a correction and testing apparatus 40 in this embodiment of this application includes a first phased array and a second phased array, where the first phased array is a to-be-tested phased array, the first phased array includes a first RF channel, the second phased array includes a second RF channel, a topology of the first RF channel has a mirror symmetry relationship with a topology of the second RF channel, and a radiation front of the second phased array and a radiation front of the first phased array are spaced by a subwavelength distance. The correction and testing apparatus 40 includes:

a receiving module 401, configured to receive, through the second RF channel, a coupling signal sent through the first RF channel;

a determining module 402, configured to determine, based on the coupling signal received by the receiving module 401, an amplitude deviation value and a phase deviation value that correspond to the first RF channel;

a correction module 403, configured to: if the amplitude deviation value and the phase deviation value determined by the determining module 402 satisfy a preset error correction condition, correct an amplitude coefficient and a phase coefficient that correspond to the first RF channel to obtain a target amplitude coefficient and a target phase coefficient; and a measurement module 404, configured to measure performance indicator parameters of the first phased array by using the target amplitude coefficient and the target phase coefficient corrected by the correction module 403.

In one embodiment, the correction and testing apparatus 40 includes the first phased array and the second phased array. The first phased array is a to-be-tested phased array, the first phased array includes the first RF channel, the second phased array includes the second RF channel, the first RF channel has a correspondence with the second RF channel, and the radiation front of the second phased array and the radiation front of the first phased array are spaced by the subwavelength distance. The receiving module 401 receives, through the second RF channel, the coupling signal sent through the first RF channel. The determining module 402 determines, based on the coupling signal received by the receiving module 401, the amplitude deviation value and the phase deviation value that correspond to the first RF channel. If the amplitude deviation value and the phase deviation value determined by the determining module 402 satisfy the preset error correction condition, the correction module 403 corrects the amplitude coefficient and the phase coefficient that correspond to the first RF channel to obtain the target amplitude coefficient and the target phase coefficient. The measurement module 404 measures the performance indicator parameters of the first phased array by using the target amplitude coefficient and the target phase coefficient corrected by the correction module 403.

In one embodiment of this application, the correction and testing apparatus is provided. A calibrated mirror phased array and a to-be-tested phased array are disposed face to face by a subwavelength distance, and fast amplitude-phase correction is performed on all RF channels of the to-be-tested phased array by using a face-to-face direct coupling mechanism between antenna array elements, thereby improving test efficiency, reducing a floor area, and lowering costs. This can greatly reduce time required for phased array correction and improve test efficiency of a phased array product.

In one embodiment, based on the embodiment corresponding to FIG. 13, in another embodiment of the correction and testing apparatus 40 provided in the embodiments of this application, the first phased array includes a plurality of first RF channels, and the second phased array includes a plurality of second RF channels.

The receiving module 401 is configured to: switch off the plurality of second RF channels;

(1) switch on an $n^{th}$ second RF channel in the plurality of second RF channels, where n is a positive integer;

(2) receive, through the $n^{th}$ second RF channel, a coupling signal sent through an $n^{th}$ first RF channel, where the $n^{th}$ second RF channel has a mirror symmetry relationship with the $n^{th}$ first RF channel; and (3) switch off the $n^{th}$ second RF channel; and perform operations of step (1) to step (3) separately on the plurality of second RF channels having a mirror symmetry relationship with the plurality of first RF channels, until the coupling signals are all received by the plurality of second RF channels.

In addition, in one embodiment of this application, first, all the second RF channels corresponding to the first RF channels are switched off; then, these second RF channels are sequentially switched on; and finally, the coupling signal sent through each first RF channel is received through each second RF channel. In the foregoing manner, amplitude-phase correction and measurement can be performed on the to-be-tested phased array in a one-by-one manner, that is, correction and testing can be performed on each first RF channel. Compared with performing correction and testing on a plurality of RF channels simultaneously, this application helps to improve accuracy of correction and testing.

In one embodiment, based on the embodiment corresponding to FIG. 13, in another embodiment of the correction and testing apparatus 40 provided in the embodiments of this application, the determining module 402 is specifically configured to obtain, based on the coupling signal, an amplitude value and a phase value that correspond to the first RF channel;

calculate, based on the amplitude value and a preset amplitude value, the amplitude deviation value corresponding to the first RF channel; and calculate, based on the phase value and a preset phase value, the phase deviation value corresponding to the first RF channel.

In addition, in one embodiment of this application, the amplitude value and the phase value that correspond to the first RF channel are obtained based on the coupling signal, and then the required amplitude deviation value and the required phase deviation value are calculated by using the preset amplitude value and the preset phase value respectively. In the foregoing manner, deviation values between the currently measured amplitude and phase values and the preset amplitude and phase values can be obtained, and the deviation values are used to determine whether the RF channel has an exception or a fault, thereby helping to improve applicability and operability of the solution.

Figure 14:
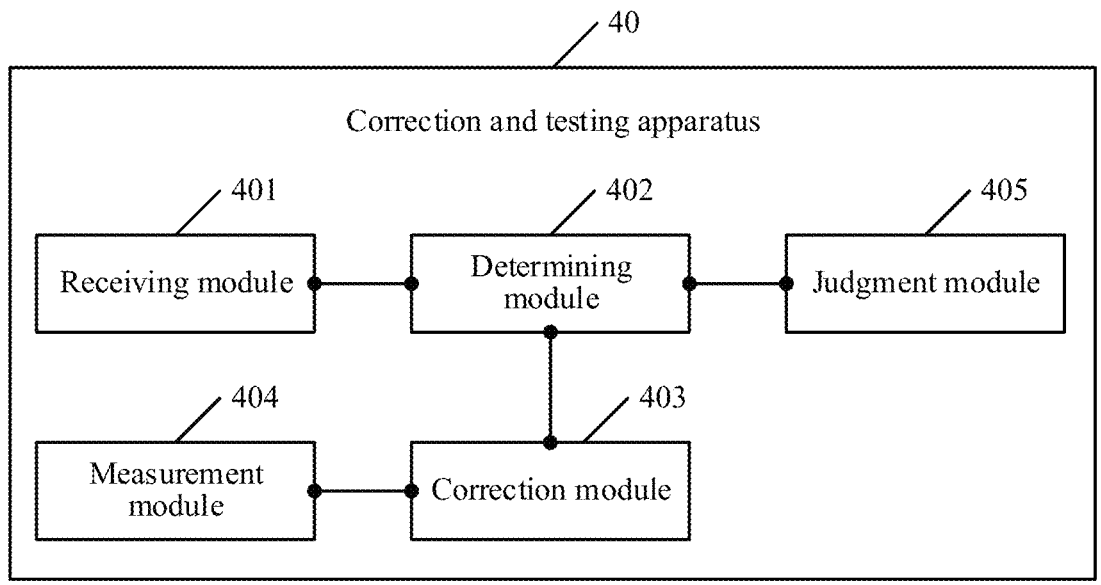
FIG. 14 is a schematic diagram of another embodiment of the correction and testing apparatus according to an embodiment of this application.

In one embodiment, based on the embodiment corresponding to FIG. 13, referring to FIG. 14, in another embodiment of the correction and testing apparatus 40 provided in the embodiments of this application, the correction and testing apparatus 40 further includes:

a judgment module 405, configured to: after the determining module 402 determines the amplitude deviation value and the phase deviation value based on the coupling signal, determine whether an absolute value of the amplitude deviation value falls within a preset amplitude error range, and whether an absolute value of the phase deviation value falls within a preset phase error range, where the determining module 402 is further configured to: if the judgment module 405 determines that the absolute value of the amplitude deviation value is greater than or equal to a preset amplitude error value, and that the absolute value of the phase deviation value falls within the preset phase error range, determine that the amplitude deviation value and the phase deviation value satisfy the preset error correction condition.

Further, in one embodiment of this application, after the amplitude deviation value and the phase deviation value are obtained, whether the absolute value of the amplitude deviation value falls within the preset amplitude error range, and whether the absolute value of the phase deviation value falls within the preset phase error range are further determined. If the absolute value of the amplitude deviation value falls within the preset amplitude error range, and the absolute value of the phase deviation value falls within the preset phase error range, it is determined that the preset error correction condition is satisfied, and subsequent RF channel amplitude-phase correction and testing can be performed. Otherwise, if the preset error correction condition is not satisfied, it is considered that the RF channel has a channel fault, subsequent channel amplitude-phase correction and testing is not performed, and the first phased array is directly disassembled from the second phased array by using a mechanical arm, and returned for corrective maintenance. Therefore, this helps to find whether a fault occurs in the to-be-tested phased array as early as possible, thereby improving applicability of the solution.

Figure 15:
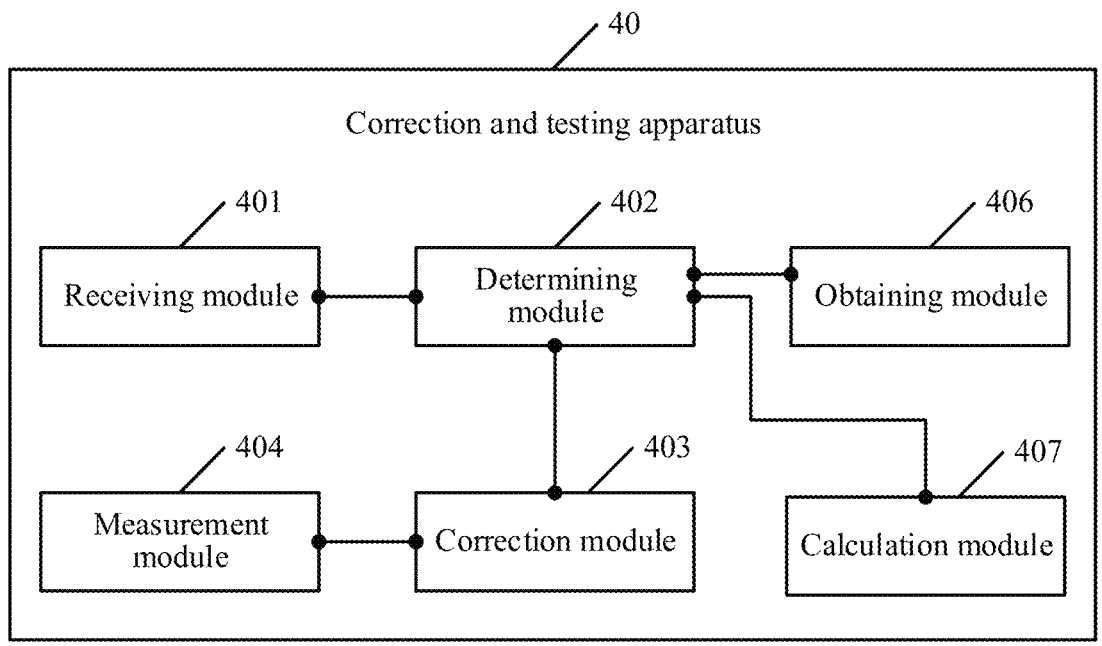
FIG. 15 is a schematic diagram of another embodiment of a correction and testing apparatus according to an embodiment of this application.

In one embodiment, based on the embodiment corresponding to FIG. 13, referring to FIG. 15, in another embodiment of the correction and testing apparatus 40 provided in the embodiments of this application, the correction and testing apparatus 40 further includes:

an obtaining module 406, configured to obtain a first position vector of the first RF channel in a space and a second position vector of the second RF channel in the space after the determining module 402 determines, based on the coupling signal, the amplitude deviation value and the phase deviation value that correspond to the first RF channel, where the determining module 402 is further configured to determine the amplitude coefficient and the phase coefficient based on the first position vector and the second position vector that are obtained by the obtaining module 406; and a calculation module 407, configured to calculate a coupling coefficient based on a near-field electric field generated by the first RF channel, a near-field electric field generated by the second RF channel, and the amplitude coefficient and the phase coefficient that are determined by the determining module 402.

Further, in one embodiment of this application, after the amplitude deviation value and the phase deviation value that correspond to the first RF channel are determined, the first position vector and the second position vector may be further obtained, and then, the coupling coefficient is calculated based on a series of parameters. In the foregoing manner, a more accurate coupling coefficient can be obtained and is used in subsequent RF channel correction and testing, thereby improving feasibility of the solution.

In one embodiment, based on the embodiment corresponding to FIG. 15, in another embodiment of the correction and testing apparatus 40 provided in the embodiments of this application, the correction and testing apparatus 40 further includes:

the correction module 403 is specifically configured to: if the first phased array is parallel to the second phased array, train the amplitude coefficient and the phase coefficient by using a preset relationship model, where the preset relationship model is a functional relationship model between the coupling coefficient and a parallel deviation position; and obtain the trained target amplitude coefficient and the trained target phase coefficient.

Further, an embodiment of this application describes how to obtain the target amplitude coefficient and the target phase coefficient when the first phased array and the second phased array are parallel to each other, that is, training the obtained amplitude coefficient and the obtained phase coefficient by using the preset relationship model. In the foregoing manner, the functional relationship model between the coupling coefficient and the parallel deviation position is set up by using an artificial neural network model, and the amplitude coefficient and the phase coefficient are corrected based on measured data by using an artificial intelligence learning algorithm, to obtain the corresponding target amplitude coefficient and the corresponding target phase coefficient, thereby improving correction precision of each first RF channel.

In one embodiment, based on the embodiment corresponding to FIG. 15, in another embodiment of the correction and testing apparatus 40 provided in the embodiments of this application, the correction and testing apparatus 40 further includes:

the correction module 403 is specifically configured to: if the first phased array is not parallel to the second phased array, obtain an included angle between the front of the first phased array and the front of the second phased array;

if the included angle is a small included angle, calculate the target amplitude coefficient based on a first amplitude correction coefficient and the amplitude coefficient, and calculate the target phase coefficient based on a first phase correction coefficient and the phase coefficient, where the first amplitude correction coefficient represents preset amplitude correction coefficients in different directions, and the first phase correction coefficient represents preset phase correction coefficients in different directions; and if the included angle is a large included angle, calculate the target amplitude coefficient based on the first amplitude correction coefficient, a second amplitude correction coefficient, and the amplitude coefficient, and calculate the target phase coefficient based on the first phase correction coefficient, a second phase correction coefficient, and the phase coefficient, where the second amplitude correction coefficient represents an amplitude correction coefficient of coupling between RF channels, and the second phase correction coefficient represents a phase correction coefficient of coupling between the RF channels.

Further, an embodiment of this application describes how to obtain the target amplitude coefficient and the target phase coefficient when the first phased array and the second phased array are not parallel to each other. That is, an included angle between the front of the first phased array and the front of the second phased array is obtained first, and a corresponding correction manner is selected based on a type of the included angle. In the foregoing manner, the amplitude coefficient and the phase coefficient are corrected based on measured data by using the amplitude correction coefficient and the phase correction coefficient, to obtain the corresponding target amplitude coefficient and the corresponding target phase coefficient, thereby improving correction precision of each first RF channel.

In one embodiment, based on the embodiment corresponding to any one of FIG. 13 to FIG. 15, in another embodiment of the correction and testing apparatus 40 provided in the embodiments of this application, the correction and testing apparatus 40 further includes:

the determining module 402 is further configured to determine a beam directivity pattern of the first phased array based on the target amplitude coefficient and the target phase coefficient after the correction module 403 obtains the target amplitude coefficient and the target phase coefficient.

Further, in one embodiment of this application, after all the RF channels of the first phased array are corrected, not only a backend processing device of the second phased array can be used to perform online monitoring on the performance indicator parameters of the first phased array, but also the target phase coefficient and the target amplitude coefficient can be used to determine the beam directivity pattern corresponding to the first phased array, to predict the beam directivity pattern of the to-be-tested phased array, thereby improving applicability of the solution.

Optionally, based on the embodiment corresponding to FIG. 13, in another embodiment of the correction and testing apparatus 40 provided in the embodiments of this application, the determining module 402 is further configured to: before the receiving module 401 receives, through the second RF channel, the coupling signal sent through the first RF channel, when a transmission amplitude value of the second RF channel is largest, determine corresponding positions of the first phased array and the second phased array.

In addition, in one embodiment of this application, after the coupling signal sent through the first RF channel is received through the second RF channel, positions of the first phased array and the second phased array need to be adjusted, and when the positions are adjusted to optimal positions, the transmission amplitude value of the second RF channel should be largest. In the foregoing manner, optimal position points of the first phased array and the second phased array can be found by using a physical position search method, and correction and testing is performed based on the optimal position points, thereby achieving a more accurate and efficient correction and testing effect.

All or some of the foregoing embodiments may be implemented by using software, hardware, firmware, or any combination thereof. When software is used to implement the embodiments, the embodiments may be implemented completely or partially in a form of a computer program product.

The computer program product includes one or more computer instructions. When the computer program instructions are loaded and executed on the computer, the procedure or functions according to the embodiments of the present invention are all or partially generated. The computer may be a general-purpose computer, a dedicated computer, a computer network, or other programmable apparatuses. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, and microwave, or the like) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid-state drive solid state disk (SSD)), or the like.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual coupling or direct coupling or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of the embodiments.

In addition, functional units in the embodiments of this application may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of this application essentially, or the part contributing to the prior art, or all or some of the technical solutions may be implemented in the form of a software product. The software product is stored in a storage medium and includes several instructions for instructing a computer device (which may be a personal computer, a server, a network device, or the like) to perform all or some of the steps of the methods described in the embodiments of this application. The foregoing storage medium includes: any medium that can store program code, such as a USB flash drive, a removable hard disk, a read-only memory (ROM), a random access memory (RAM), a magnetic disk, or a compact disc.

The foregoing embodiments are merely intended for describing the technical solutions of this application, but not for limiting this application. Although this application is described in detail with reference to the foregoing embodiments, a person of ordinary skill in the art should understand that they may still make modifications to the technical solutions described in the foregoing embodiments or make equivalent replacements to some technical features thereof, without departing from the spirit and scope of the technical solutions of the embodiments of this application.

What is claimed is:
1. A correction and testing system, comprising:
a first phased array having a first radio frequency (RF) channel, wherein the first phased array is a to-be-tested phased array, a second phased array having a second RF channel, wherein a topology of the first RF channel has a mirror symmetry relationship with a topology of the second RF channel, wherein a radiation front of the second phased array and a radiation front of the first phased array are spaced by a subwavelength distance, and wherein the second phased array is configured to receive, through the second RF channel, a coupling signal sent by the first phased array through the first RF channel, and a test instrument configured to:
  determine, based on the coupling signal, an amplitude deviation value and a phase deviation value that correspond to the first RF channel;
  if the amplitude deviation value and the phase deviation value satisfy a preset error correction condition, correct an amplitude coefficient and a phase coefficient that correspond to the first RF channel to obtain a target amplitude coefficient and a target phase coefficient; and
  measure performance indicator parameters of the first phased array by using the target amplitude coefficient and the target phase coefficient.

2. The correction and testing system according to claim 1, wherein the first phased array comprises a plurality of first RF channels, the second phased array comprises a plurality of second RF channels, the second phased array further comprises a plurality of switches and a plurality of attenuators, wherein the switches are connected to the second RF channels in a one-to-one manner, and the attenuators are connected to the second RF channels in a one-to-one manner;

the switches are configured to switch off the plurality of second RF channels;
the switches are configured to switch on a target second RF channel in the plurality of second RF channels when the plurality of second RF channels are in an off state, wherein the target second RF channel is any second RF channel in the plurality of second RF channels;
the second RF channels are configured to receive, through the target second RF channel, a coupling signal sent through a target first RF channel, until coupling signals sent through the plurality of first RF channels are all received, wherein the target first RF channel is a first RF channel in the plurality of first RF channels that has a mirror symmetry relationship with the target second RF channel; and
each attenuator is configured to perform signal attenuation processing on the coupling signal.

3. The correction and testing system according to claim 2, wherein
(1) at least one of the switches is configured to switch on an $n^{th}$ second RF channel in the plurality of second RF channels when the plurality of second RF channels are in the off state, wherein n is a positive integer;
(2) at least one of the second RF channels is used to receive, through the $n^{th}$ second RF channel, a coupling signal sent through an $n^{th}$ first RF channel, wherein the $n^{th}$ second RF channel has a mirror symmetry relationship with the $n^{th}$ first RF channel;
(3) the switch is configured to switch off the $n^{th}$ second RF channel; and
the switches and the second RF channels are configured to separately perform operations of (1) to (3) on the plurality of second RF channels having a mirror symmetry relationship with the plurality of first RF channels, until the coupling signals sent through the plurality of first RF channels are all received by the plurality of second RF channels.

4. The correction and testing system according to claim 1, wherein the test instrument comprises a vector network analysis instrument configured to:
  obtain, based on the coupling signal, an amplitude value and a phase value that correspond to the first RF channel;
  calculate, based on the amplitude value and a preset amplitude value, the amplitude deviation value corresponding to the first RF channel; and
  calculate, based on the phase value and a preset phase value, the phase deviation value corresponding to the first RF channel.

5. The correction and testing system according to claim 1, wherein the test instrument comprises a test control device configured to:
  determine whether an absolute value of the amplitude deviation value falls within a preset amplitude error range, and whether an absolute value of the phase deviation value falls within a preset phase error range; and
  if the absolute value of the amplitude deviation value falls within the preset amplitude error range, and the absolute value of the phase deviation value falls within the preset phase error range, determine that the amplitude deviation value and the phase deviation value satisfy the preset error correction condition.

6. The correction and testing system according to claim 1, wherein the test instrument is further configured to:
  obtain a first position vector of the first RF channel in a space and a second position vector of the second RF channel in the space; and
  determine the amplitude coefficient and the phase coefficient based on the first position vector and the second position vector.

7. The correction and testing system according to claim 6, wherein the test instrument is configured to:
  if the first phased array is not parallel to the second phased array, obtain an included angle between the radiation front of the first phased array and the radiation front of the second phased array;
  if the included angle is a small included angle,
    calculate the target amplitude coefficient based on a first amplitude correction coefficient and the amplitude coefficient, and
    calculate the target phase coefficient based on a first phase correction coefficient and the phase coefficient, wherein the first amplitude correction coefficient represents preset amplitude correction coefficients in different directions, and the first phase correction coefficient represents preset phase correction coefficients in different directions; and
  if the included angle is a large included angle,
    calculate the target amplitude coefficient based on the first amplitude correction coefficient, a second amplitude correction coefficient, and the amplitude coefficient, and
    calculate the target phase coefficient based on the first phase correction coefficient, a second phase correction coefficient, and the phase coefficient, wherein the second amplitude correction coefficient represents an amplitude correction coefficient of coupling between RF channels, and the second phase correction coefficient represents a phase correction coefficient of coupling between the RF channels.

8. The correction and testing system according to claim 1, wherein the test instrument is configured to:
if the first phased array is parallel to the second phased array, train the amplitude coefficient and the phase coefficient by using a preset relationship model; and
obtain the trained target amplitude coefficient and the trained target phase coefficient, wherein the preset relationship model is a functional relationship model between a coupling coefficient and a parallel deviation position.

9. The correction and testing system according to claim 8, wherein the test instrument is further configured to calculate the coupling coefficient based on a near-field electric field generated by the first RF channel, a near-field electric field generated by the second RF channel, the amplitude coefficient, and the phase coefficient.

10. The correction and testing system according to claim 1, wherein
the test instrument is further configured to determine a beam directivity pattern of the first phased array based on the target amplitude coefficient and the target phase coefficient.

11. The correction and testing system according to claim 1, wherein the test instrument is further configured to determine, as corresponding positions of the first phased array and the second phased array, positions of the first phased array and the second phased array obtained when a transmission amplitude value of the second RF channel is largest.

12. A test instrument, configured to:
receive, through a second radio frequency (RF) channel, a coupling signal sent by a first phased array through a first RF channel;
determine an amplitude deviation value and a phase deviation value that correspond to the first RF channel;
if the amplitude deviation value and the phase deviation value satisfy a preset error correction condition, correct an amplitude coefficient and a phase coefficient that correspond to the first RF channel to obtain a target amplitude coefficient and a target phase coefficient; and
measure performance indicator parameters of the first phased array by using the target amplitude coefficient and the target phase coefficient, wherein
the first phased array is a to-be-tested phased array, the first phased array comprises the first RF channel, a second phased array comprises the second RF channel, a topology of the first RF channel has a mirror symmetry relationship with a topology of the second RF channel, and a radiation front of the second phased array and a radiation front of the first phased array are spaced by a subwavelength distance.

13. The test instrument according to claim 12, wherein the test instrument comprises a vector network analysis instrument configured to:
obtain, based on the coupling signal, an amplitude value and a phase value that correspond to the first RF channel;
calculate, based on the amplitude value and a preset amplitude value, the amplitude deviation value corresponding to the first RF channel; and
calculate, based on the phase value and a preset phase value, the phase deviation value corresponding to the first RF channel.

14. The test instrument according to claim 12, wherein the test instrument comprises a test control device configured to:
determine whether an absolute value of the amplitude deviation value falls within a preset amplitude error range, and whether an absolute value of the phase deviation value falls within a preset phase error range; and
if the absolute value of the amplitude deviation value falls within the preset amplitude error range, and the absolute value of the phase deviation value falls within the preset phase error range, determine that the amplitude deviation value and the phase deviation value satisfy the preset error correction condition.

15. The test instrument according to claim 12, wherein the test instrument is further configured to:
obtain a first position vector of the first RF channel in a space and a second position vector of the second RF channel in the space; and
determine the amplitude coefficient and the phase coefficient based on the first position vector and the second position vector.

16. The test instrument according to claim 15, wherein if the first phased array is not parallel to the second phased array, the test instrument is configured to:
obtain an included angle between the radiation front of the first phased array and the radiation front of the second phased array;
if the included angle is a small included angle, calculate the target amplitude coefficient based on a first amplitude correction coefficient and the amplitude coefficient, and calculate the target phase coefficient based on a first phase correction coefficient and the phase coefficient, wherein the first amplitude correction coefficient represents preset amplitude correction coefficients in different directions, and the first phase correction coefficient represents preset phase correction coefficients in different directions; and
if the included angle is a large included angle, calculate the target amplitude coefficient based on the first amplitude correction coefficient, a second amplitude correction coefficient, and the amplitude coefficient, and calculate the target phase coefficient based on the first phase correction coefficient, a second phase correction coefficient, and the phase coefficient, wherein the second amplitude correction coefficient represents an amplitude correction coefficient of coupling between RF channels, and the second phase correction coefficient represents a phase correction coefficient of coupling between the RF channels.

17. The test instrument according to claim 12, wherein if the first phased array is parallel to the second phased array, the test instrument is configured to:
train the amplitude coefficient and the phase coefficient by using a preset relationship model; and
obtain the trained target amplitude coefficient and the trained target phase coefficient, wherein the preset relationship model is a functional relationship model between a coupling coefficient and a parallel deviation position.

18. The test instrument according to claim 17, wherein the test instrument is further configured to calculate the coupling coefficient based on a near-field electric field generated by the first RF channel, a near-field electric field generated by the second RF channel, the amplitude coefficient, and the phase coefficient.

19. The test instrument according to claim 12, wherein the test instrument is further configured to determine a beam directivity pattern of the first phased array based on the target amplitude coefficient and the target phase coefficient.

20. The test instrument according to claim 12, wherein the test instrument is further configured to determine, as corresponding positions of the first phased array and the second phased array, positions of the first phased array and the second phased array obtained when a transmission amplitude value of the second RF channel is largest.

* * * * *